(12) United States Patent
McVeigh

(10) Patent No.: US 11,303,294 B2
(45) Date of Patent: Apr. 12, 2022

(54) DIGITAL TO ANALOG CONVERTERS

(71) Applicant: Cirrus Logic International Semiconductor Ltd., Edinburgh (GB)

(72) Inventor: Gavin McVeigh, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/086,949

(22) Filed: Nov. 2, 2020

(65) Prior Publication Data

US 2021/0184692 A1 Jun. 17, 2021

Related U.S. Application Data

(60) Provisional application No. 62/949,011, filed on Dec. 17, 2019, provisional application No. 62/948,984, filed on Dec. 17, 2019.

(51) Int. Cl.
| | | |
|---|---|---|
| *H03M 1/78* | (2006.01) | |
| *H03M 1/80* | (2006.01) | |
| *H03M 1/16* | (2006.01) | |
| *H03M 1/06* | (2006.01) | |
| *H03M 1/66* | (2006.01) | |
| *G01L 1/22* | (2006.01) | |
| *H03F 3/45* | (2006.01) | |

(52) U.S. Cl.
CPC .......... *H03M 1/785* (2013.01); *G01L 1/2268* (2013.01); *H03M 1/0607* (2013.01); *H03M 1/16* (2013.01); *H03M 1/662* (2013.01); *H03M 1/802* (2013.01); *H03F 3/45* (2013.01); *H03M 1/808* (2013.01)

(58) Field of Classification Search
CPC ........ H03M 1/785; H03M 1/802; H03M 1/16; H03M 1/0607; H03M 1/662; H03M 1/808; H03M 1/66; H03M 1/664; H03M 1/742; H03M 1/76; H03M 1/80; G01L 1/2268; G01L 1/14; G01L 1/16; G01L 1/18; G01L 1/2262; H03F 3/45; H03K 17/9625
USPC .......................................... 341/121, 144–145
See application file for complete search history.

(56) References Cited

U.S. PATENT DOCUMENTS

| | | | |
|---|---|---|---|
| 4,401,974 A | | 8/1983 | Jarrett et al. |
| 4,465,996 A | * | 8/1984 | Boyacigiller ........... H03M 1/10 341/118 |
| 4,595,910 A | | 6/1986 | Wine |
| 4,947,172 A | * | 8/1990 | Suzuki .................. H03M 1/069 341/118 |
| 6,411,237 B1 | * | 6/2002 | Lautzenhiser .......... H03L 7/189 341/144 |

(Continued)

FOREIGN PATENT DOCUMENTS

EP 1542367 A2 6/2005

OTHER PUBLICATIONS

Combined Search and Examination Report under Sections 17 and 18(3), UKIPO, Application No. GB2000268.9, dated Mar. 18, 2020.

*Primary Examiner* — Khai M Nguyen
(74) *Attorney, Agent, or Firm* — Jackson Walker L.L.P.

(57) ABSTRACT

The present disclosure provides digital to analog conversion circuitry comprising: a set of input nodes for receiving a digital input code; an output node for outputting an analog output signal representative of the input code; and a plurality of selectable conversion elements, wherein a parameter of each of the plurality of selectable conversion elements is configured such that a transfer function between the input code and the output analog signal is non-monotonic.

18 Claims, 18 Drawing Sheets

(56) References Cited

U.S. PATENT DOCUMENTS

| | | | |
|---|---|---|---|
| 6,801,149 B2* | 10/2004 | Walton | H03M 1/664 |
| | | | 341/150 |
| 7,336,211 B1* | 2/2008 | Lai | H03M 1/06 |
| | | | 341/118 |
| 8,884,799 B2* | 11/2014 | Price | H03M 1/002 |
| | | | 341/145 |
| 9,337,860 B1 | 5/2016 | Li et al. | |
| 9,438,252 B1* | 9/2016 | He | H03L 7/18 |
| 2002/0171575 A1 | 11/2002 | Marten | |

* cited by examiner

DIGITAL TO ANALOG CONVERTERS

The present disclosure claims priority to U.S. Provisional Patent Application Ser. No. 62/949,011, filed Dec. 17, 2019, and U.S. Provisional Patent Application Ser. No. 62/948,984, filed Dec. 17, 2019, each of which is incorporated by reference herein in its entirety.

FIELD OF THE INVENTION

The present disclosure relates to the field of digital to analog converters.

BACKGROUND

Digital to analog converters (DACs) are used in a wide variety of applications to convert a digital input signal (often referred to as a DAC code) representing, for example, a decimal value, into an analog output signal. For example, DACs are commonly used in audio applications so as to convert an input stream of digital audio data into an analog audio signal that can be amplified and used to drive an audio output transducer, e.g. a loudspeaker.

For accurate conversion between the digital and analog domains, it is important for a DAC to be monotonic, in the sense that the analog signal output by the DAC moves in the same direction as the input DAC code. Thus, for each step increase in the value represented by the input DAC code, the output analog signal should exhibit a corresponding increase in magnitude. Similarly, for each step decrease in the value represented by the input DAC code, the output analog signal should exhibit a corresponding decrease in magnitude.

According to a first aspect the invention provides digital to analog conversion circuitry comprising:
  a set of input nodes for receiving a digital input code;
  an output node for outputting an analog output signal representative of the input code; and
  a plurality of selectable conversion elements, wherein a parameter of each of the plurality of selectable conversion elements is configured such that a transfer function between the input code and the output analog signal is non-monotonic.

The plurality of selectable conversion elements may comprise selectable resistances and the parameter may comprise a resistance value.

The resistances may be coupled in parallel with each other.

Alternatively, the resistances may be arranged in a ladder configuration.

The plurality of selectable conversion elements may comprise selectable capacitances and the parameter may comprise a capacitance value.

The plurality of selectable conversion elements may comprise selectable current sources and the parameter may comprise an output current value.

The plurality of selectable conversion elements may be arranged in a plurality of arrays of selectable conversion elements. A parameter of each of the plurality of selectable conversion elements of each of the plurality of arrays may be configured such that a transfer function between an input code input to the array and an analog signal output by the array is non-monotonic.

For example, the circuitry may comprise first, second and third arrays of selectable conversion elements.

The conversion elements of the third array may have the same parameter values as corresponding conversion elements of the first array.

The first, second and third arrays of selectable conversion elements may be arranged in series between a reference voltage and ground.

The circuitry may be configured to produce a differential output signal between a first output node between the first array and second array and a second output node between the second array and the third array.

The digital to analog conversion may further comprise a first output amplifier having an input coupled to the first output node and a second output amplifier coupled to the second output node.

The first, second and third arrays may comprise selectable resistances or selectable capacitances.

According to a second aspect the invention provides a digital to analog converter (DAC) comprising:
  an array of selectable conversion elements; and
  amplifier circuitry,
    wherein the conversion elements of the array are weighted such that a given DAC output value can be produced by a plurality of different combinations of selectable conversion elements.

The selectable conversion elements may be resistors.

Alternatively, the selectable conversion elements may be capacitors.

Alternatively, the selectable conversion elements may be current sources.

The amplifier circuitry may comprise operational amplifier or buffer circuitry.

According to a third aspect the invention provides a DAC comprising:
  an array of selectable resistances; and
  amplifier circuitry,
    wherein the resistances of the array are weighted such that a given DAC output value can be produced by a plurality of different input DAC codes.

According to a fourth aspect the invention provides a DAC comprising:
  an array of selectable resistances; and
  amplifier circuitry,
    wherein the resistances of the array are weighted so as to produce a plurality of overlapping DAC output signal ranges.

According to a fifth aspect the invention provides a DAC for receiving a digital input code and outputting a non-monotonic analog signal.

According to a sixth aspect the invention provides a DAC comprising a non-monotonic transfer function for receiving an input DAC code and outputting a non-monotonic analog signal.

According to a seventh aspect the invention provides a DAC comprising a non-monotonic transfer function for receiving a plurality of input DAC codes and outputting at least one non-monotonic analog signal range.

According to an eighth aspect the invention provides a DAC comprising a non-monotonic transfer function for receiving a plurality of input DAC codes and outputting a plurality of non-monotonic analog signal ranges.

According to a ninth aspect the invention provides a DAC for receiving digital input codes, comprising:
  a plurality of selectable conversion elements for configuration wherein at least one transfer function between an input code and an output analog signal is non-monotonic.

According to a tenth aspect the invention provides a non-monotonic DAC for correcting an offset voltage.

According to an eleventh aspect the invention provides a DAC comprising a non-monotonic transfer function.

According to a twelfth aspect the invention provides a DAC comprising both monotonic and non-monotonic transfer functions.

According to a thirteenth aspect the invention provides a DAC circuitry for receiving digital input codes and outputting analog signals representative of the input codes, comprising:

a plurality of selectable conversion elements for providing either a monotonic or non-monotonic transfer function based on one or more of the plurality of selectable conversion elements.

According to a fourteenth aspect the invention provides DAC circuitry comprising a plurality of selectable conversion elements for providing either a monotonic or non-monotonic transfer function wherein the transfer function is based on one or more of the plurality of selectable conversion elements.

According to a fifteenth aspect the invention provides a DAC comprising a plurality of selectable conversion elements wherein the transfer function of the DAC is based on the selectable conversion elements.

According to a sixteenth aspect the invention provides a DAC comprising selectable conversion elements and two transfer functions wherein each transfer function is based on a selection of conversion elements.

BRIEF DESCRIPTION OF THE DRAWINGS

Embodiments of the invention will now be described, strictly by way of example only, with reference to the accompanying drawings, of which:

FIGS. 13b-13e schematically illustrate the operation of switching devices of the non-monotonic DAC circuitry of FIG. 12a;

DETAILED DESCRIPTION

Figure 1:
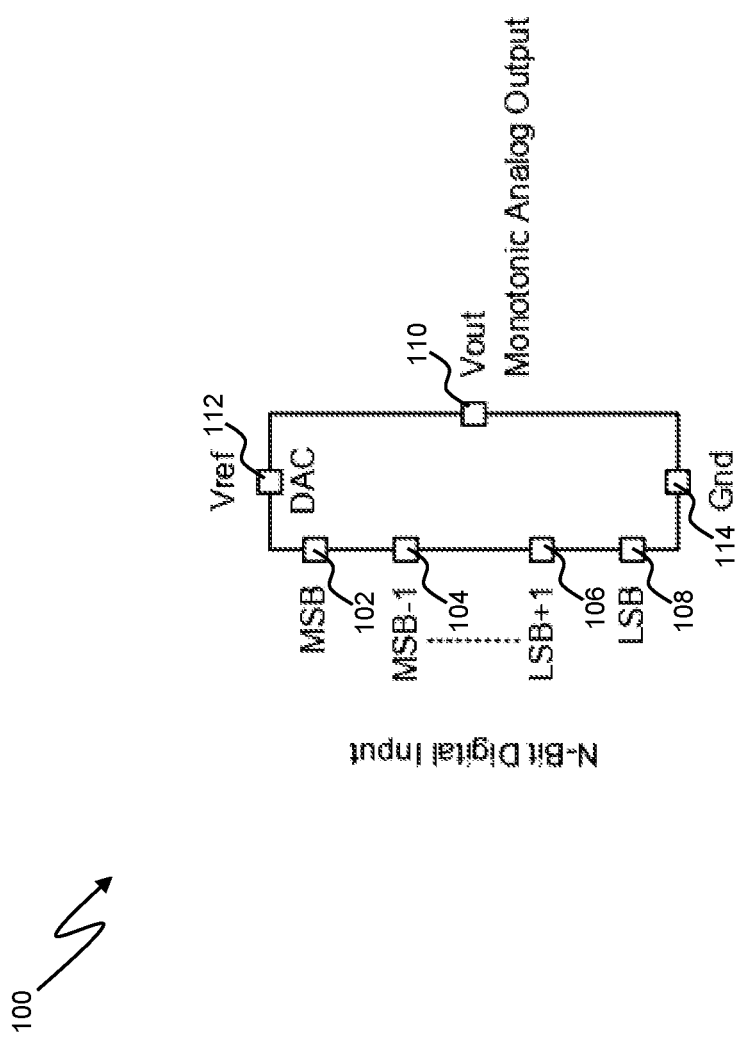
FIG. 1 is a generalised schematic representation of N-bit monotonic digital to analog converter (DAC) circuitry.

Referring first to FIG. 1, known N-bit monotonic digital to analog converter (DAC) circuitry is shown generally at 100. The DAC 100 in the illustrated example is a 4-bit DAC that is operative to convert a 4-bit parallel digital input (also referred to as a DAC code) into an output analog output value. However, it should be appreciated that DAC 100 could be arranged to be an N-bit DAC, where N is a positive integer.

The DAC circuitry 100 has a set of input nodes comprising first, second, third and fourth input nodes 102, 104, 106, 108 for receiving a 4-bit parallel digital input. The first input node 102 is configured to receive a most significant bit (MSB) of the digital input, whilst the fourth input node 108 is configured to receive a least significant bit (LSB) of the digital input. The second and third input nodes 104, 106 are configured to receive the second and third most significant bits, respectively, of the digital input. The DAC circuitry 100 also has an output node 110 for outputting a monotonic analog output signal Vout. The DAC circuitry 100 also includes a first reference voltage node 112 for connecting the DAC circuitry 100 to a first reference voltage (Vref) and a second reference voltage node 114 for connecting the DAC circuitry to a second reference voltage such as ground (Gnd). The DAC circuitry 100 is operative to receive a 4-bit input DAC code representing, for example, a decimal value, and to output an analog output voltage Vout whose magnitude is indicative of the value represented by the input DAC code.

Figure 2:
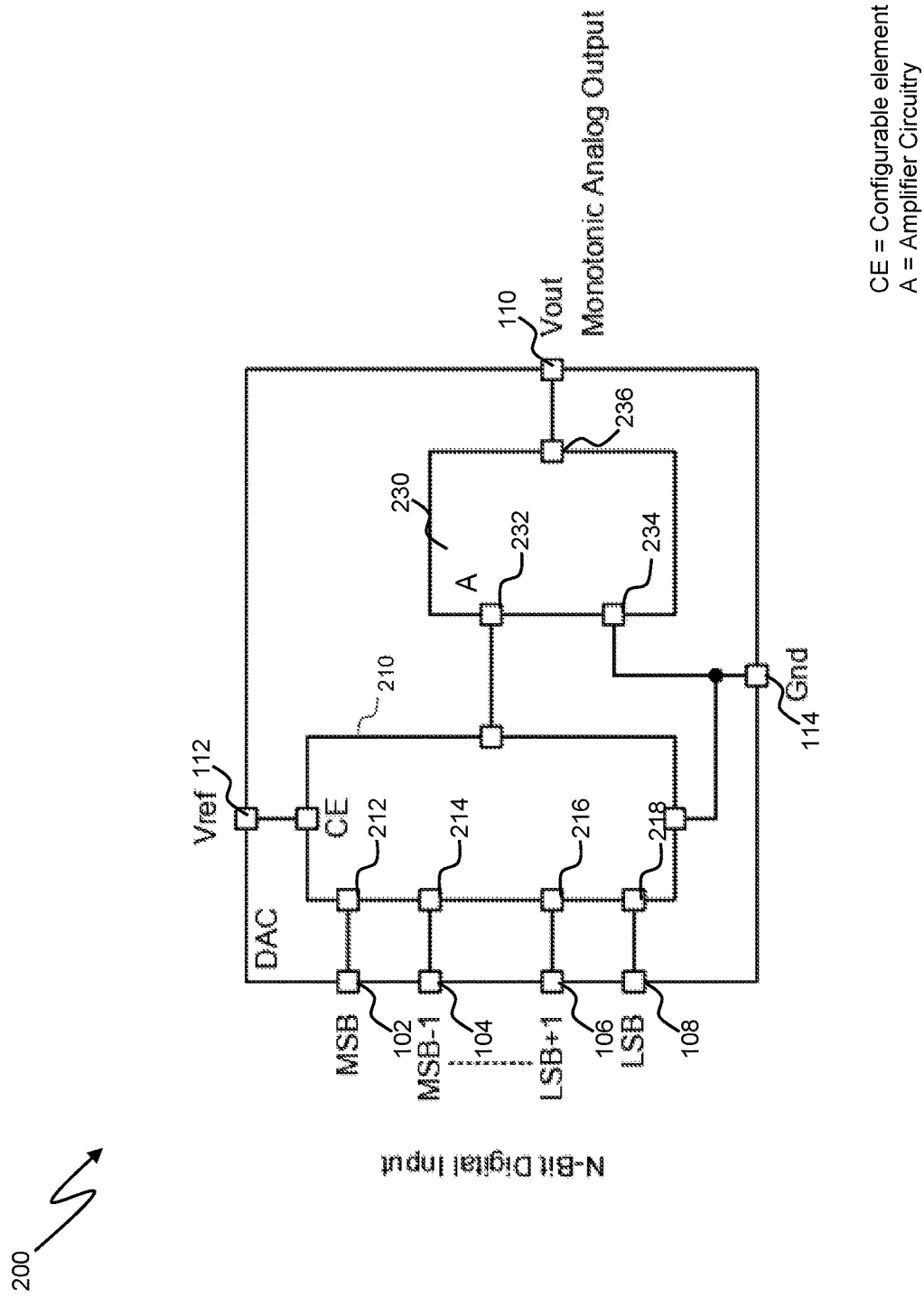
FIG. 2 is a generalised schematic representation of N-bit monotonic DAC circuitry including an array of configurable elements and an amplifier or buffer.

FIG. 2 is a generalised schematic representation of known N-bit monotonic DAC circuitry including an array of configurable elements. The DAC circuitry 200 of FIG. 2 includes input nodes 102-108, an output node 110 and first and second reference voltage nodes 112, 114 that are similar to the corresponding nodes of the DAC circuitry 100 of FIG. 1.

The DAC circuitry 200 further includes an array 210 of configurable elements having input nodes 212, 214, 216, 218 that are coupled, respectively, to the input nodes 102, 104, 106, 108 so as to receive an N-bit input DAC code that is input to the DAC circuitry 200. The array 210 has an output node that is coupled to a first input 232 of amplifier circuitry, which in the illustrated example is implemented as an operational amplifier (op-amp) 230 (but which could, where appropriate, be implemented as a buffer or buffer circuitry). In the illustrated example a second input 234 of the op-amp 230 is coupled to the second reference voltage node 114, such that the second reference voltage (e.g. ground or some other reference voltage) is received at the second input 234 of the op-amp 230. An output of the op-amp 230 is coupled to the output node 110 of the DAC circuitry to provide the output signal Vout.

In operation of the DAC circuitry 200, an N-bit input DAC code representing, for example, a decimal value, is received at the input nodes 102-108. Elements of the array 210 of configurable elements are selected in accordance with the input DAC code, and the array 210 of configurable elements outputs an output signal, which is dependent upon the selected elements of the array 210, to the first input of the op-amp 230. The op-amp 230 in turn outputs an output signal that is indicative of the value represented by the input DAC code.

Figure 3:
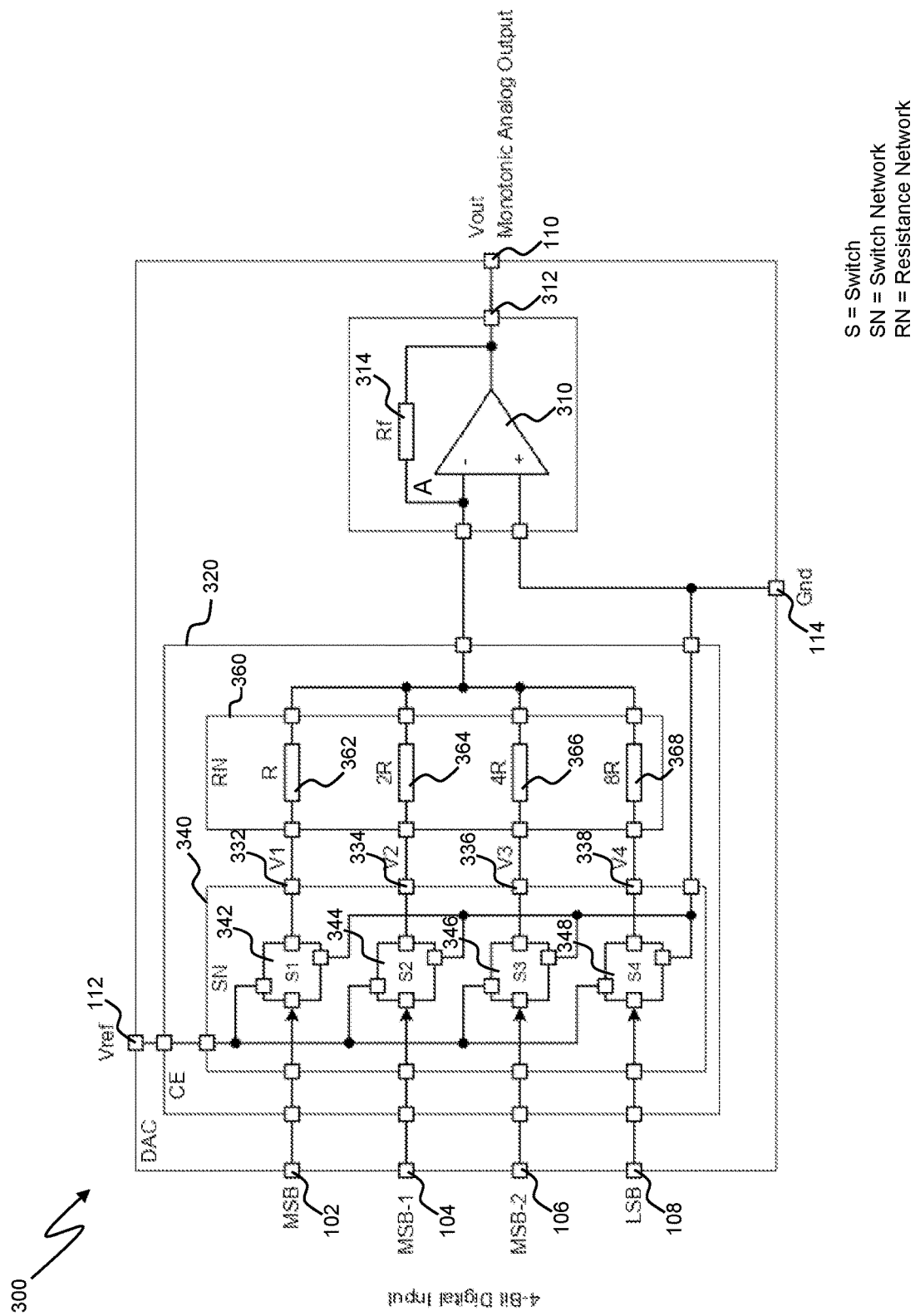
FIG. 3 is a schematic representation of 4-bit monotonic DAC circuitry comprising an amplifier and an array of configurable elements that includes a network of resistances and a network of switching devices.

Turning now to FIG. 3, known digital to analog converter (DAC) circuitry is shown generally at 300. The DAC 300 is a 4-bit DAC that is operative to convert a 4-bit parallel digital input (also referred to as a DAC code) into an output analog output value. Again, it should be appreciated that although the DAC circuitry 300 is illustrated as a 4-bit DAC, and it will be understood and appreciated by one of ordinary skill in the art that the DAC circuitry 300 could be arranged to be an N-bit DAC, where N is a positive integer.

The DAC circuitry 300 has a set of input nodes comprising first, second, third and fourth input nodes 102, 104, 106, 108 for receiving a 4-bit parallel digital input. The first input node 102 is configured to receive a most significant bit (MSB) of the digital input, whilst the fourth input node 108 is configured to receive a least significant bit (LSB) of the digital input. The second and third input nodes 104, 106 are configured to receive the second and third most significant bits, respectively, of the digital input. The DAC circuitry 300 also has an output node 110 for outputting an analog output signal Vout, and first and second reference voltage nodes 112, 114 for receiving respective first and second reference voltages Vref and ground (Gnd).

The DAC circuitry 300 includes amplifier circuitry, which in this example is implemented as an operational amplifier (op-amp) 310 configured as a summing amplifier (but which could, where appropriate, be implemented as a buffer or buffer circuitry). A non-inverting input of the op-amp 310 is coupled to a second reference voltage, which in the illustrated example is ground, but which could also be some other reference voltage. An inverting input of the op-amp 310 is coupled to an output terminal 312 of the op-amp 310 by means of a feedback resistor Rf 314, thereby forming a negative feedback path. The output terminal 312 of the op-amp 310 is also coupled to the output terminal 110 of the DAC circuitry 100 to provide the output analog signal Vout.

The DAC circuitry 300 further includes an array 320 of selectable conversion elements. The array 320 includes an array or network 340 of selection elements including first, second, third and fourth switch devices 342, 344, 346, 348 coupled to an array or network 360 of resistances including first, second, third and fourth resistances 362, 364, 366, 368, such that each switch device 342-348 of the switch network 340 controls the selection of an associated resistance 362-368 of the resistance network 360.

Figure 4B:
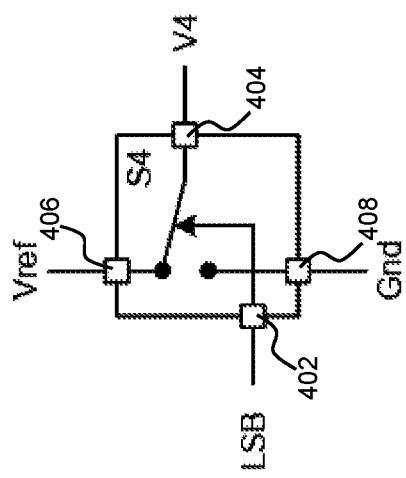
FIGS. 4a and 4b schematically illustrate the operation of the switching devices of the monotonic DAC circuitry of FIG. 3.
Figure 4A:
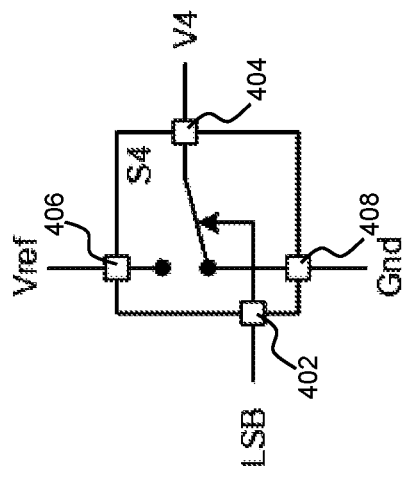

As shown in FIGS. 4a and 4b, each of the switch devices 342-348 of the switch network 340 includes a first (control) terminal 402, which is coupled to a respective one of the input nodes 102-108 and a second (output) terminal 404, which is coupled to a respective one of the resistances 362-368 of the array 360. Each of the switch devices 342-348 also includes a third terminal 406 that is coupled to the first reference voltage Vref and a fourth terminal 408 that is coupled to the second reference voltage e.g. ground (Gnd).

A signal received at the control terminal 402 of each of the switching devices 342-348 controls the operation of the switching device, either to couple the second (output) terminal 404 to the third terminal, as shown in FIG. 4a, or to couple the second (output) terminal 404 to the fourth terminal, as shown in FIG. 4b. Thus, the output terminal 404 of each switching device 342-348 can be coupled either to the first reference voltage (Vref) or the second reference voltage, e.g. ground (Gnd) depending upon the value of the signal received at the control terminal 402 of the switching device 342-348 from the input node 102-108 to which the switching device 342-348 is coupled.

In one example, a binary 1 (or "high") signal received at an input node 102, 104, 106, 108 will cause the associated switching device 342, 344, 346, 348 to couple the associated resistance 362, 364, 366, 368 to the first reference voltage Vref, whereas a binary 0 (or "low") signal received at an input terminal 102, 104, 106, 108 will cause the associated switching device 342, 344, 346, 348 to couple the resistance 362, 364, 366, 368 to the second reference voltage, e.g. ground.

As will be appreciated by one of ordinary skill in the art the controllable switching devices 342-348 may alternatively be configured such that a binary 1 (or "high") signal received at an input terminal 102, 104, 106, 108 can be used to couple the resistance 366-368 to the second reference voltage (e.g. ground), whereas a binary 0 (or "low") signal received at an input terminal 102, 104, 106, 108 will cause the associated switching device 342-348 to coupe the associated resistance 362-368 to the first reference voltage Vref.

Thus, the voltages V1, V2, V3, V4 supplied to the resistances 362-368 of the array 320 will be either 0 v (where the second reference voltage is ground) or Vref, depending on the state of the controllable switching devices 342-348.

For example, the first input terminal 102 is coupled to the control terminal of the first controllable switching device 342, such that when, for example, a binary 1 signal is received at the first input terminal 102 the first controllable switching device 342 couples the first resistance 362 to the first reference voltage Vref. The voltage V1 supplied by to the first resistance 362 via the first controllable switching device 342 is therefore Vref.

The resistance values of the first, second, third and fourth resistances 362, 364, 366, 368 are selected, in this example, so as to be binary weighted. Thus, if the resistance value of the first resistance 362 is R, then the resistance value of the second resistance 364 is 2R, the resistance value of the third resistance 366 is 4R and the resistance value of the fourth resistance 368 is 8R, i.e. a 1, 2, 4, 8 (binary) weighting. It will be appreciated by those skilled in the art that other resistance weightings and/or ratios may be selected so as to achieve a similar result.

In operation of the circuitry 300, the output voltage Vout is dependent upon the ratios of the feedback resistance Rf 314 to the various combinations of the first, second, third and fourth resistances 362, 364, 366, 368 and upon the voltages V1, V2, V3, V4 input via the switch devices 342-348. The output voltage Vout is defined as:

$$Vout = -\left(\frac{Rf}{R}V1 + \frac{Rf}{2R}V2 + \frac{Rf}{4R}V3 + \frac{Rf}{8R}V4\right) \quad (1)$$

For illustrative purposes, assume that Rf=R=1 kΩ and Vref=−8 v. Thus:

$$Vout = -\left(V1 + \frac{1}{2}V2 + \frac{1}{4}V3 + \frac{1}{8}V4\right) \quad (2)$$

The analog output voltage Vout for every possible input DAC code with these values of R, Rf and Vref, (assuming that a supply voltage to the op-amp 112 is sufficient to support the output voltages shown), is shown in Table 1 below, together with an indication of the direction of change in the analog output voltage Vout as the input DAC code changes.

TABLE 1

| Input DAC code | Analog Vout | Vout v DAC Code-Direction |
| --- | --- | --- |
| 0000 | 0 | — |
| 0001 | 1 | ↑ |
| 0010 | 2 | ↑ |
| 0011 | 3 | ↑ |
| 0100 | 4 | ↑ |
| 0101 | 5 | ↑ |
| 0110 | 6 | ↑ |
| 0111 | 7 | ↑ |
| 1000 | 8 | ↑ |
| 1001 | 9 | ↑ |
| 1010 | 10 | ↑ |
| 1011 | 11 | ↑ |
| 1100 | 12 | ↑ |
| 1101 | 13 | ↑ |
| 1110 | 14 | ↑ |
| 1111 | 15 | ↑ |

As can be seen from the third column of Table 1 above, in the monotonic DAC circuitry 300 the value or magnitude of the analog output signal follows the value of the decimal value represented by the input DAC code. As the decimal value represented by the input DAC code increases, the value of the analog output signal Vout also increases; for every increment in the decimal value represented by the input DAC code there is a corresponding increment in the value of the analog output signal Vout.

Figure 5:
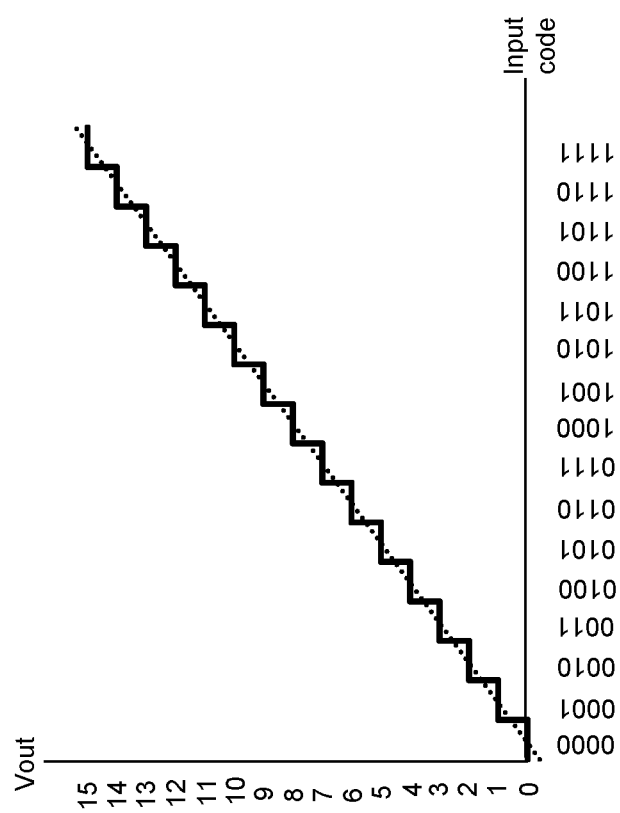
FIG. 5 illustrates a monotonic and linear transfer function between a digital input signal and an analog output signal of the DAC circuitry of FIG. 3.

This transfer function between the input DAC code and the output analog voltage Vout is illustrated graphically in FIG. 5, which clearly shows the direction of change in the analog output voltage Vout as the input DAC code changes, as shown in Table 1 and described above (note that for the transfer function illustrated in FIG. 5, Vref is negative). Thus, as can be seen in this Figure, the value or magnitude of the analog output signal follows the value of the decimal value represented by the input DAC code. As the decimal value represented by the input DAC code increases, the value of the analog output signal Vout also increases. For every increment in the decimal value represented by the input DAC code there is a corresponding increment in the value of the analog output signal Vout. Thus, the DAC circuitry 300 is monotonic and outputs a monotonic output signal Vout.

As will be understood by those skilled in the art, a transfer function (also known as system function or network function) of an electronic device, such as a DAC for example, is a mathematical function which models the device's output for each possible input.

In this example, in addition to being monotonic, the transfer function of the DAC circuitry 300 is also linear, since the magnitude of a step increase in the value of the analog output Vout for a given increment in the decimal value represented by the input DAC code is uniform, as illustrated by the dashed line. For example, the increment from 0001 to 0010 in the input DAC code (representing a decimal increment of magnitude 1) produces an increment of magnitude 1 in the value of the analog output Vout (which increments from 1 to 2), whilst the increment from 1110 to 1111 (which also represents a decimal increment of magnitude 1) produces an increment of magnitude 1 in the value of the analog output Vout (which increments from 14 to 15).

However, it will be appreciated that it is possible for a DAC to be monotonic but non-linear.

Figure 6:
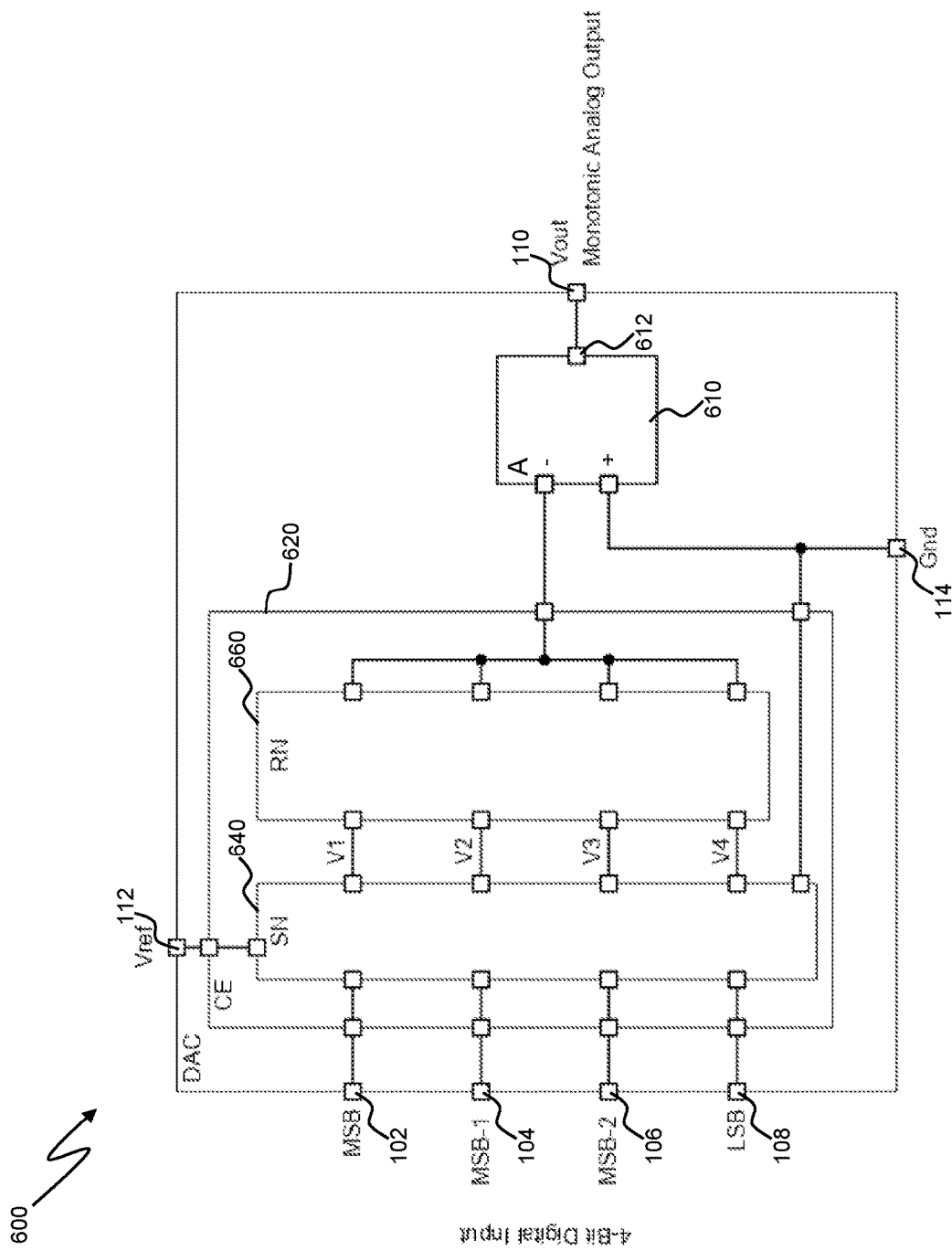
FIG. 6 is a generalised schematic representation of 4-bit monotonic DAC circuitry comprising an array of configurable elements that includes a network of resistances and a network of switching devices.

FIG. 6 is a generalised schematic representation of 4-bit monotonic DAC circuitry 600, comprising a set of input nodes 102, 104, 106, 108, an output node 110, a first reference voltage node 112 for coupling the DAC circuitry 600 to a first reference voltage (Vref) and a second reference voltage node 114 for coupling the DAC circuitry 600 to a second reference voltage, e.g. ground (Gnd). The DAC circuitry 600 includes amplifier circuitry, which in this example is implemented as an op-amp 610 having an output coupled to the output node 110, and an array 620 of selectable conversion elements (but which could, where appropriate, be implemented as a buffer or buffer circuitry). The array 620 includes a switch network 640 that is coupled to the input nodes 102-108. The switch network 640 may be similar to the switch network 340 of the DAC circuitry 300 of FIG. 3, for example. The array 620 also includes a resistance network 660, having inputs that are coupled to outputs of the switch network 640 and outputs that are coupled to a first input of the op-amp 610. A second input of the op-amp 610 is coupled, in the illustrated example, to the second reference voltage node 114 (but could equally be coupled to some other reference voltage). The resistance network 660 may be similar to the resistance network 360 of the DAC circuitry 300 of FIG. 3, for example.

The switch network 640 is coupled to the first reference voltage node 112 and to the second reference voltage node 114, such that individual switching devices of the switch network 640 can couple associated resistances of the resistance network 660 either to the first reference voltage Vref or the second reference voltage (e.g. ground) depending on the value of an input signal at the input nodes 102-108. In this way, an analog output signal at the output node 110 representative of the digital input signal at the input nodes 102-108 can be generated. As in the example illustrated in FIG. 3, the DAC circuitry 600 has a monotonic transfer function such that the signal at the output node 110 changes monotonically as the input digital signal changes.

As discussed above, for accurate reproduction of an input signal it is important that DACs are monotonic resulting in a monotonic output signal. However, the applicant has discovered that in some applications, such as compensating for offsets (e.g. DC offsets) or error signals in analog circuitry, it can be advantageous for a DAC to be intentionally designed to be non-monotonic.

Figure 7:
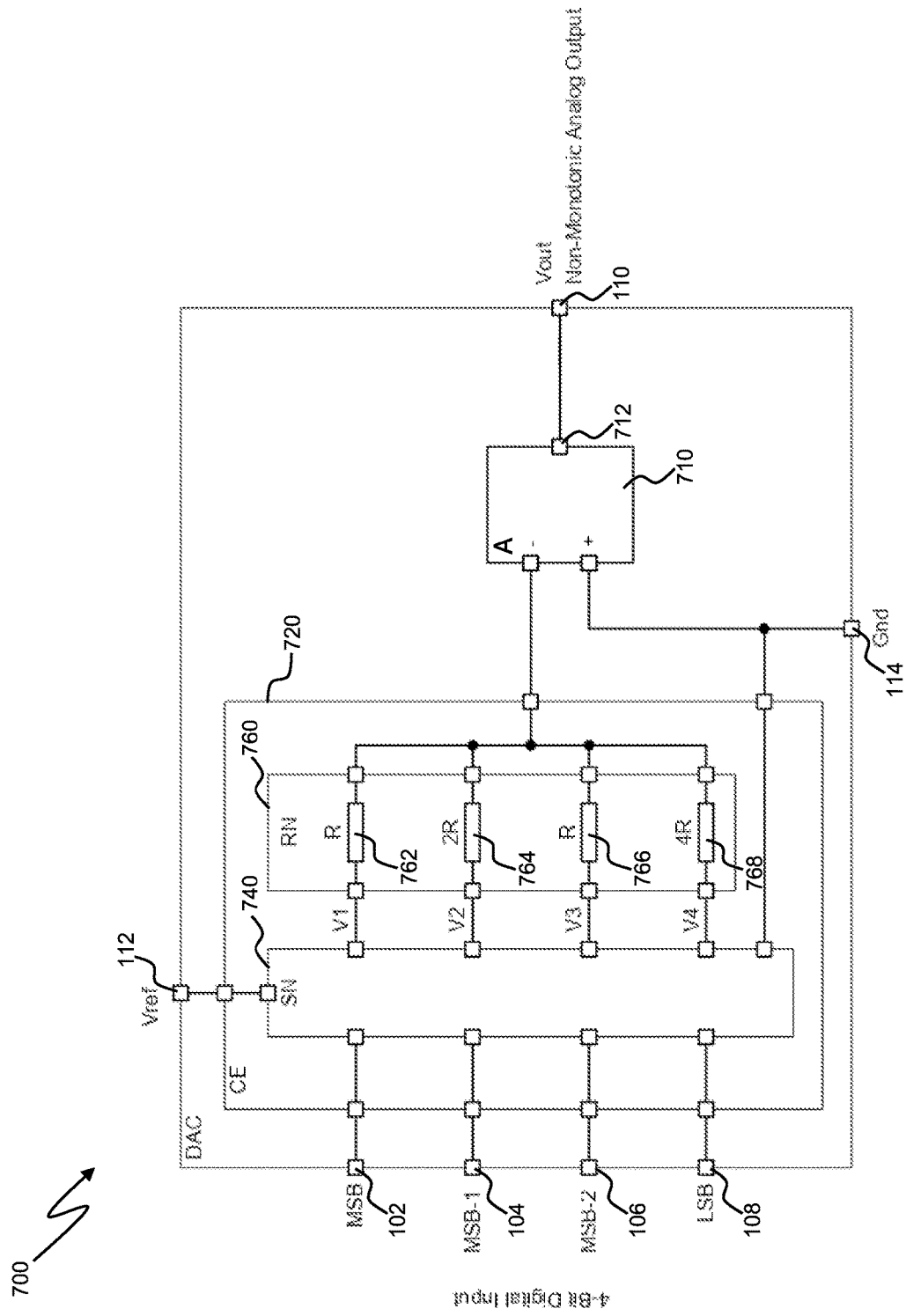
FIG. 7 is a schematic representation of 4-bit non-monotonic DAC circuitry comprising an array of configurable elements that includes a network of resistances and a network of switching devices.

FIG. 7 is a schematic representation of non-monotonic DAC circuitry 700. The circuitry 700 is similar to that of FIG. 3, so like reference numerals are used to refer to like elements. As in the circuitry 300 of FIG. 3, the circuitry 700 includes an array 720 of selectable conversion elements including a switch network 740 and a resistance network 760. The non-monotonic DAC circuitry 700 differs from the DAC circuitry 300 of FIG. 3 in that the values of the resistances 762, 764, 766, 768 of the resistance network 760 do not follow a binary sequence, but are instead configured so as to produce a non-monotonic transfer function between the input DAC code and the output analog signal Vout.

In this example the values of the resistances 762, 764, 766, 768 are configured to be R, 2R, R, 4R respectively. Thus, in this example the values of the resistances associated with MSB-2 and LSB are R and 4R respectively, as opposed to 4R and 8R respectively in the FIG. 3 example. Applying a version of equation 2 modified to take account of the altered resistance values of the resistances 762-768:

$$Vout = -\left(V1 + \frac{1}{2}V2 + \frac{1}{4}V3 + \frac{1}{8}V4\right)$$

(again assuming for illustrative purposes that Rf=R=1 kΩ and Vref=−8 v), the value of the output analog signal Vout for every input DAC code (assuming that a supply voltage to the op-amp 112 is sufficient to support the output voltages shown) is shown in Table 2 below, together with an indication of the direction of change in the analog output voltage Vout as the input DAC code changes.

TABLE 2

| Input DAC code | Analog Vout | Vout v DAC Code-Direction |
| --- | --- | --- |
| 0000 | 0 | — |
| 0001 | 2 | ↑ |
| 0010 | 8 | ↑ |
| 0011 | 10 | ↑ |
| 0100 | 4 | ↓ |
| 0101 | 6 | ↑ |
| 0110 | 12 | ↑ |
| 0111 | 14 | ↑ |
| 1000 | 8 | ↓ |
| 1001 | 10 | ↑ |
| 1010 | 16 | ↑ |
| 1011 | 18 | ↑ |
| 1100 | 12 | ↓ |
| 1101 | 14 | ↑ |
| 1110 | 20 | ↑ |
| 1111 | 22 | ↑ |

As can be seen from the third column of Table 2 above, in the non-monotonic DAC circuitry of FIG. 7 the value or magnitude of the analog output signal does not always follow the value of the decimal value represented by the input DAC code. As the decimal value represented by the input DAC code increases, there is not always a corresponding increase in the value of the analog output signal Vout.

Figure 8:
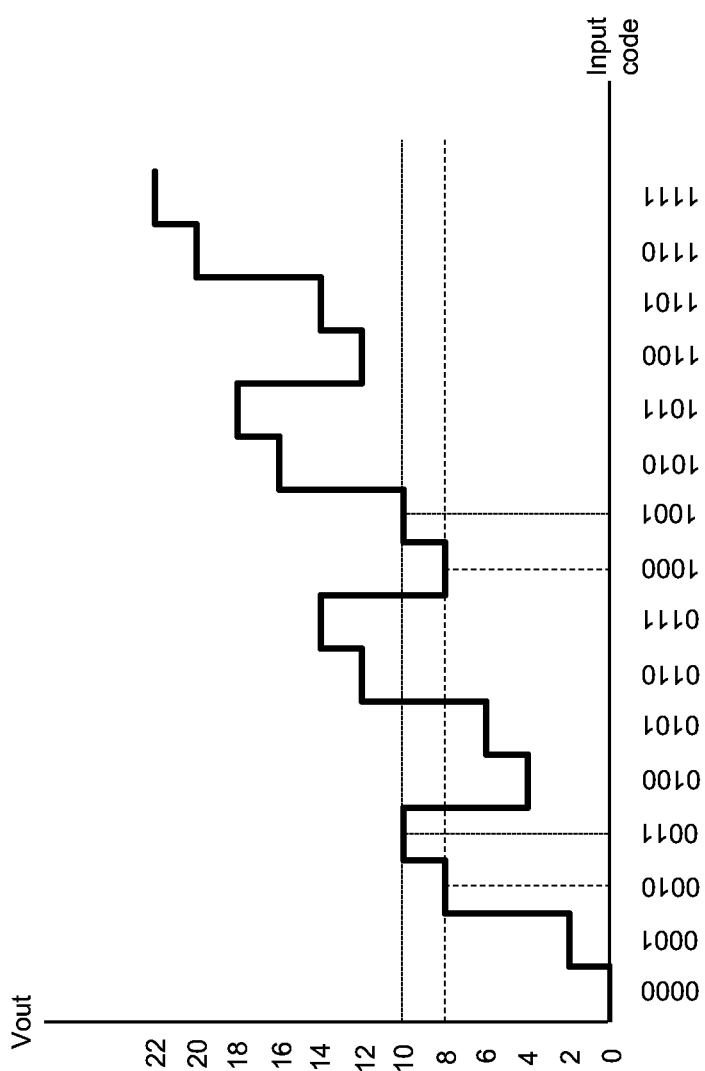
FIG. 8 illustrates a non-monotonic transfer function between a digital input signal and an analog output signal of the DAC circuitry of FIG. 7.

This transfer function or input-output characteristic between the input DAC code and the output analog voltage Vout is illustrated graphically in FIG. 8. As can be seen in this Figure, the value or magnitude of the analog output signal does not always follow the value of the decimal value represented by the input DAC code. Instead, the relative weightings of the resistance values of the resistances 762-768 produce a plurality of overlapping DAC output signal ranges, i.e. non-monotonic signal ranges, as can be seen in FIG. 8. FIG. 8 shows, for example, that the output signal range for the input code range 0000-0011 partially overlaps with the output signal range for the input code range 0100-0111.

Thus, as the decimal value represented by the input DAC code increases, the value of the analog output signal Vout does not always increase; there are instances where an increment in the decimal value represented by the input DAC code causes a decrement in the value of the analog output signal Vout. As a result, a given output analog signal value may be produced by two or more different input digital codes.

For example, the analog output signal value 8 can be produced by the input digital code 0010 or the input digital code 1000, whilst the analog signal value 10 can be produced by the input digital code 0011 or the input digital code 1001. Thus, a given analog output signal value may be produced by selecting different ones or different combinations of the resistances 762-768.

Thus, the DAC circuitry 700 is non-monotonic, resulting in a non-monotonic output signal. The non-monotonic output signal Vout can be seen to step-down as well as step-up. Any desired non-monotonic transfer function can be produced by appropriate selection and configuration of the resistance values of the resistances 762-768. It should also be noted that the non-monotonic output signal in this illustrated example is non-linear in that the step-sizes of some of the decimal values of the output signal Vout are different from others.

Figure 9:
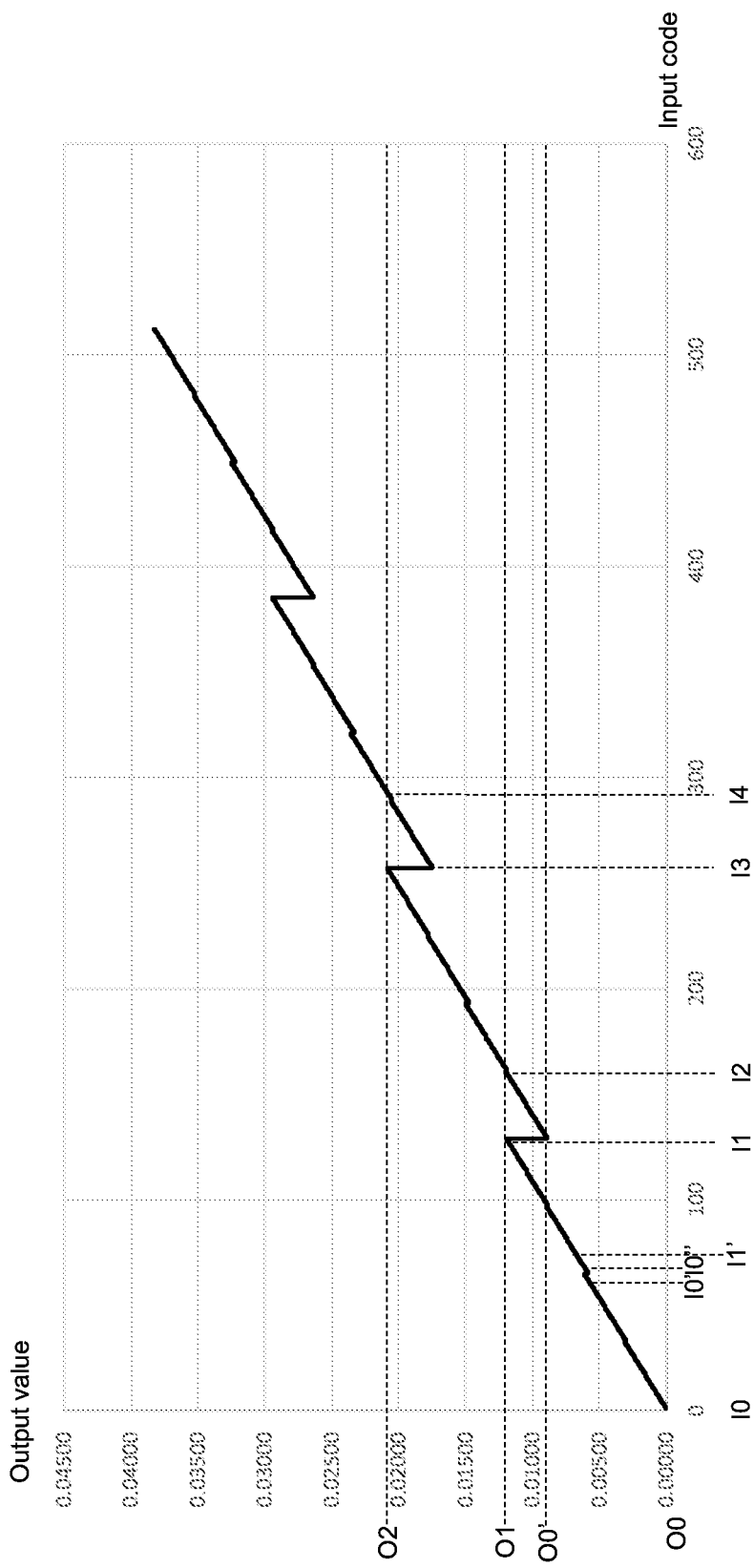
FIG. 9 is a graphical illustration of a generalised input-output characteristic of a non-monotonic DAC.

FIG. 9 is a graphical illustration of a generalised input-output characteristic of a non-monotonic DAC in accordance with the present disclosure. As can be seen in FIG. 9 the non-monotonic input-output characteristic of the DAC exhibits overlapping output subranges that exhibit regressive behaviour in portions of the input-output characteristic. For example, for input codes between I1 and I2, the input-output characteristic is regressive, in the sense that at I1 the output value O0' returns or regresses to a level that also occurred at an "earlier" input code, i.e. an input code representing a decimal number that is lower than a decimal number represented by the input code I1. Only when the input code exceeds I2 does the output value begin to adopt values that were not output for "earlier" input codes. Similarly, for input codes between I3 and I4, the input-output characteristic is regressive. Only when the input code exceeds I4 does the output value begin to adopt values that were not output for "earlier" input codes.

In other words, the non-monotonic input-output characteristic of the DAC includes or exhibits overlapping output subranges that return to a lower or less developed state (i.e. regress) in portions of the input-output characteristic.

Put another way, the non-monotonic input-output characteristic of the DAC includes or exhibits overlapping subranges that revert back to previous values in portions of the input-output characteristic.

Thus, the non-monotonic input-output characteristic of the DAC exhibits overlapping subranges that return to previous values in portions of the input characteristic.

Accordingly, for portions of the range of input DAC codes, the value of the output of the DAC or IDAC will overlap with the value of the output of the DAC of IDAC for "earlier" or lower value input DAC codes.

Figure 10:
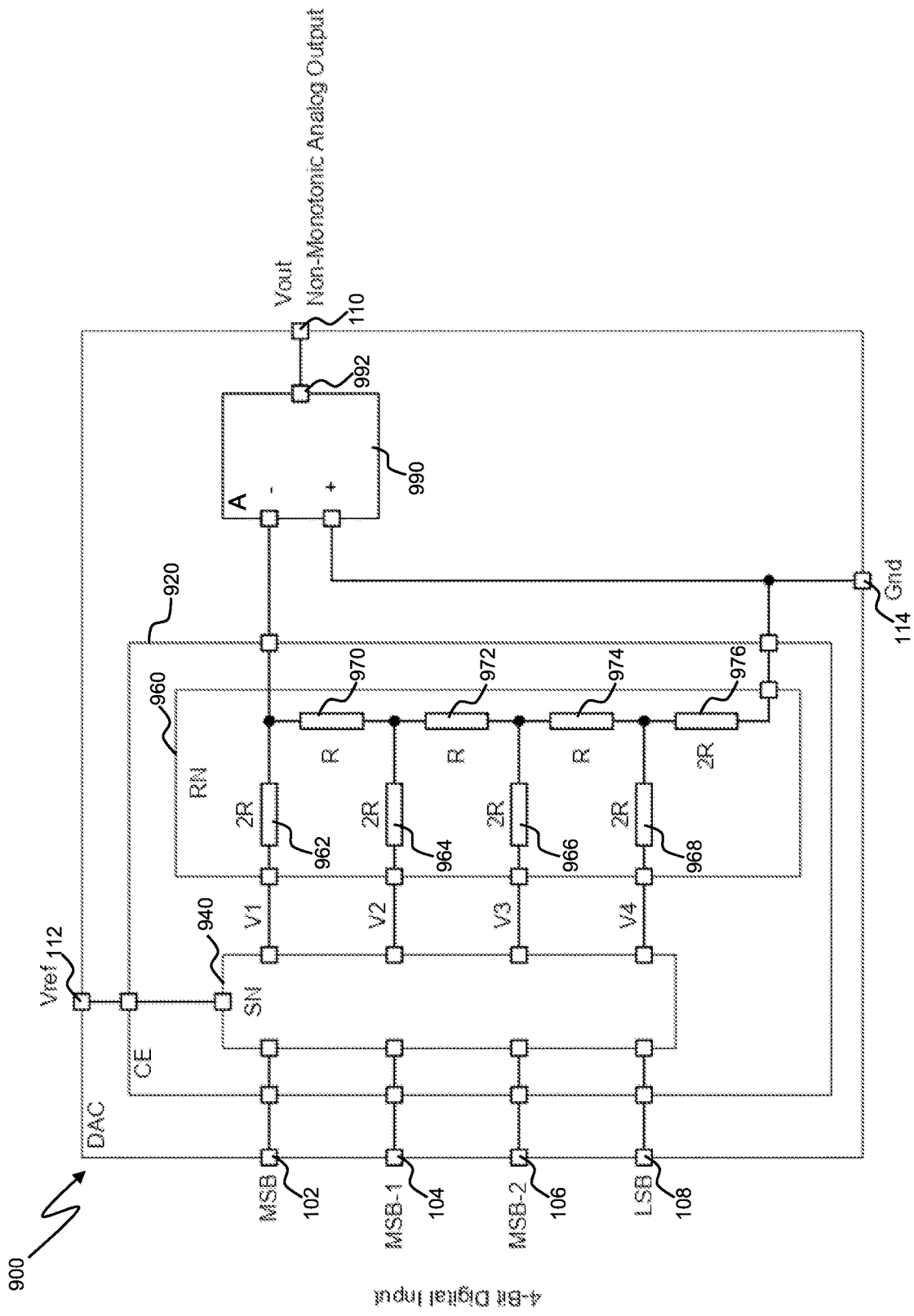
FIG. 10 is a schematic diagram illustrating alternative 4-bit non-monotonic DAC circuitry comprising an array of configurable elements that includes a network of resistances arranged in a ladder configuration and a network of switching devices.

FIG. 10 is a schematic representation of 4-bit non-monotonic DAC circuitry 900 which uses a plurality of resistances arranged in a ladder configuration as conversion elements.

The circuitry 900 has a set of input nodes comprising first, second, third and fourth input nodes 102, 104, 106, 108 for receiving a 4-bit parallel digital input. The first input node 102 is configured to receive a most significant bit (MSB) of the digital input, whilst the fourth input node 108 is configured to receive a least significant bit (LSB) of the digital input. The second and third input nodes 104, 106 are configured to receive the second and third most significant bits, respectively, of the digital input. The DAC circuitry 900 also has an output node 110 for outputting an analog output signal Vout.

The circuitry 900 includes an array 920 of selectable conversion elements. The array 920 includes a switch network 940 having a set of input terminals that are coupled to the set of input nodes 102-108. The switch network 940 may be similar to the switch network 340 of the DAC circuitry 300 of FIG. 3. The array 920 also includes a resistance network 960 having a set of input terminals that are coupled to output terminals of the switch network 940. The resistance network 960 includes a plurality of resistances 962, 964, 966, 968, 970, 972, 974, 976 arranged in a ladder configuration.

The first input node 102 is coupled to a first terminal of a first resistance 962, via a first switching device of the switch network 940. Similarly, the second, third and fourth input nodes 104, 106, 108 are coupled to first terminals of respective second, third and fourth resistances 964, 966, 968 via respective second, third and fourth switching devices of the switch network 940. A fifth resistance 970 is coupled between second terminals of the first and second resistances 962, 964. A sixth resistance 972 is coupled between second terminals of the second and third resistances 964, 966. A seventh resistance 974 is coupled between second terminals of the third and fourth resistances 966, 968. An eighth resistance 976 is coupled between a reference voltage, which in the illustrated example is ground, and the second terminal of the fourth resistance 968. A node that connects the second terminal of the first resistance 962 to the fifth resistance 970 is also coupled to an inverting input terminal of amplifier circuitry, which in this example is implemented as an operational amplifier (op-amp) 990 (but which could, where appropriate, be implemented as a buffer or buffer circuitry). A non-inverting (+) input of the op-amp 990 is coupled to the second reference voltage, e.g. ground (Gnd). An output 992 of the op-amp 990 is coupled to the output terminal 110, and is also coupled to the inverting input (−) of the op-amp 990 by a feedback resistance Rf (not shown in FIG. 10).

Although the illustrated example uses an op-amp configured as an inverting amplifier, it will be appreciated that in alternative configurations the op-amp 990 could be configured as a buffer, such that the non-inverting input (+) of the op-amp 990 receives the signal output by the resistance network 960 and the inverting input (−) of the op-amp 990 is coupled to the output of the op-amp 990 so as to receive the signal output by the op-amp 990. Indeed, it is also recognised that in some cases the amplifier may not be necessary, depending upon the choice of circuit elements and circuit architecture. However, regardless of its construct the circuit of FIG. 10 is known as a DAC.

As will be appreciated by those skilled in the art, the DAC circuitry 900 is similar to an R-2R ladder based DAC. In such a DAC, the value of each of the resistances of the "rungs" that are coupled to the input nodes (102-108) via the switch network 940 is 2R, and the value of the resistances of the "rails" that couple adjacent "rungs" to each other is R.

In contrast, in the circuitry 900 of FIG. 10, the values of the resistances 962-976 do not follow this pattern. Instead, the resistance values of the resistances 962, 964, 966, 968, 976 are configured so as to produce a non-monotonic transfer function between the input DAC code and the output analog signal Vout. In particular, in the illustrated example the configuration of the ratio R-2R ladder is designed such that the ratio is (R+ΔR):2R, where ΔR in this case is negative, giving rise to a non-monotonic transfer function. The desired ratio can be achieved by appropriate selection of resistance values of the resistances 962-976. Any desired non-monotonic transfer function can be produced by appropriate selection and configuration of the values of the resistances 962-976.

Figure 11:
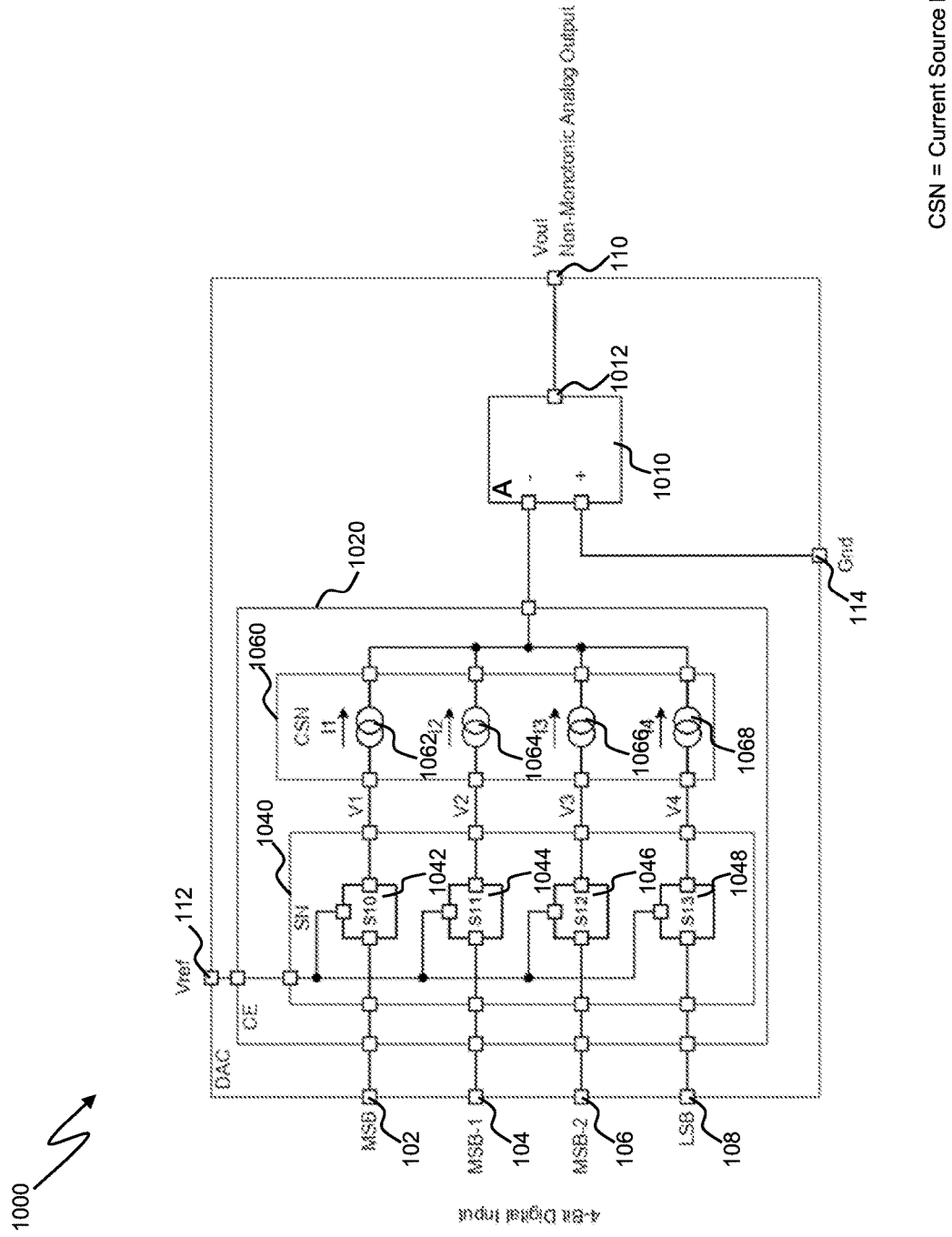
FIG. 11 is a schematic diagram illustrating further alternative 4-bit non-monotonic DAC circuitry comprising an array of configurable elements that includes a network of current sources and a network of switching devices.

FIG. 11 is a schematic representation of 4-bit non-monotonic DAC circuitry 1000 which uses a plurality of switched current sources as conversion elements, as opposed to resistors as illustrated in FIGS. 3, 6, 7 and 10.

The DAC circuitry 1000 is similar to the DAC circuitry 700 of FIG. 7, and so like reference numerals have been used to refer to like elements. The DAC circuitry 1000 differs from the DAC circuitry 700 in that instead of the network 760 of selectable resistances, the DAC circuitry 1000 includes a network 1060 of selectable current sources comprising first, second, third and fourth fixed current sources 1062, 1064, 1066, 1068 which can be selectively coupled to an input of amplifier circuitry (in the illustrated example the inverting input (−) of an op-amp 1010) by means of respective controllable switching devices 1042, 1044, 1046, 1048 of a switch network 1040. Each current source 1062, 1064, 1066, 1068 supplies a respective fixed current I1, I2, I3, I4.

Figure 12A:
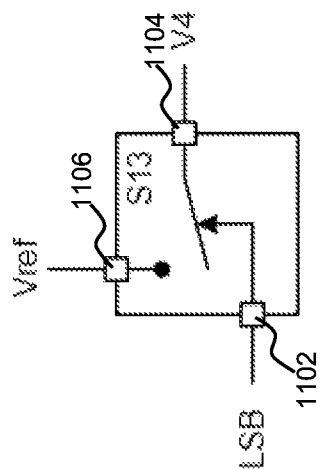
FIGS. 12a and 12b schematically illustrate the operation of switching devices of the non-monotonic DAC circuitry of FIG. 11.
Figure 12B:
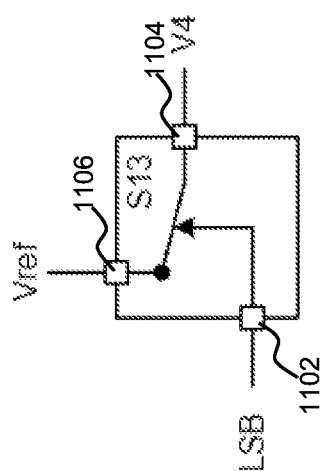

As shown in FIGS. 12a and 12b, each of the switch devices 1042-1048 of the switch network 1040 includes a first (control) terminal 1102, which is coupled to a respective one of the input nodes 102-108 and a second (output) terminal 1104, which is coupled to a respective one of the current sources 1062-1068 of the network 1060. Each of the switch devices 1042-1048 also includes a third terminal 1006 that is coupled to the first reference voltage Vref.

A signal received at the control terminal 1002 of each of the switching devices 1042-1048 controls the operation of the switching device, either to couple the second (output) terminal 1004 to the third terminal 1006, as shown in FIG. 12a, or to decouple the second (output) terminal 1104 from the third terminal 1006, as shown in FIG. 12b. Thus, the output terminal 1104 of each switching device 1042-1048 can be coupled to or decoupled from coupled the first reference voltage (Vref) depending upon the value of the signal received at the control terminal 1102 of the switching device 1042-1048 from the input node 102-108 to which the switching device 1042-1048 is coupled. It will be understood by those skilled in the art that the control of the current sources can be accomplished in a plurality of ways, however the overall behaviour remains: either switching in or out a current to effect a change in the DAC output depending on the digital control stimulus.

Thus, the total current I supplied to the inverting input of the op-amp 1010 by the configurable array 1020 will be dependent on the state of the controllable switching devices 1042-1048. For example, for an input DAC code of 1001, the first and fourth switching devices 1042, 1048 are closed, whilst the second and third switching devices 1044, 1046 are open. Thus, the first and fourth fixed current sources 1062, 1068 are coupled to the non-inverting input of the op-amp 112, such that the total current input to the op-amp 112 is I1+I4.

The op-amp 112 is operative to convert the total current received at its inverting input into an analog output voltage Vout, which is output via the output node 110.

The fixed currents I1, I2, I3, I4 supplied by the fixed current sources 1062-1068 are configured so as to produce a non-monotonic transfer function between the input DAC code and the output analog signal Vout. Any desired non-monotonic transfer function can be produced by appropriate configuration or selection of the values of the fixed currents I1, I2, I3, I4 supplied by the fixed current sources 1062-1068.

Although the non-monotonic DAC circuitry 1000 is described above as producing an output voltage Vout based on the total current received at the inverting input of the op-amp 1010, it will be appreciated by those skilled in the art that the DAC circuitry 1000 could also be configured or adapted to produce a current output based on the total current input, or to produce a voltage or current output based on a total voltage input to the op-amp 1010.

Figure 13A:
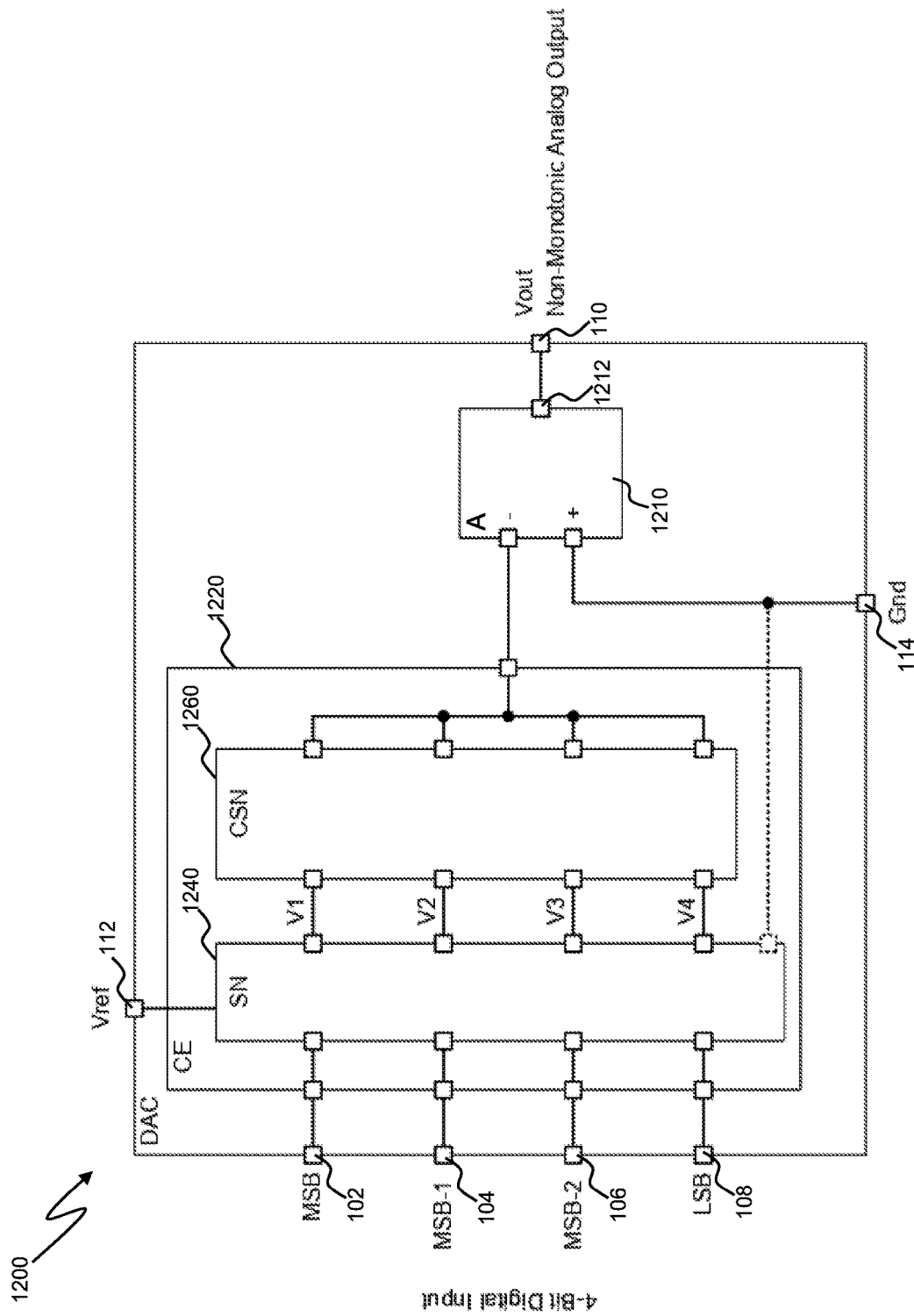
FIG. 13a is a generalised schematic diagram illustrating 4-bit non-monotonic DAC circuitry comprising an array of configurable elements that includes a network of current sources and a network of switching devices.

FIG. 13a is a generalised schematic representation of 4-bit non-monotonic DAC circuitry 1200, comprising a set of input nodes 102, 104, 106, 108, an output node 110, a first reference voltage node 112 for coupling the DAC circuitry 1200 to a first reference voltage Vref and a second reference voltage node 114 for coupling the DAC circuitry 1200 to a second reference voltage, e.g. ground (Gnd). The DAC circuitry 1200 includes an op-amp 1210 having an output coupled to the output node 110, and an array 1220 of selectable conversion elements.

The array 1220 includes a switch network 1240 that is coupled to the input nodes 102-108. The switch network 1240 may be similar to the switch network 1040 of the DAC circuitry 100 of FIG. 11, for example, or may include a plurality of switching elements of the kind described below with reference to FIGS. 13b-13e.

The array 1220 also includes a current source network 1260, having inputs that are coupled to outputs of the switch network 1240 and outputs that are coupled to a first input of the op-amp 1210. A second input of the op-amp 1210 is coupled to the second reference voltage node 114. The current source network 1260 may be similar to the current source network 1060 of the DAC circuitry 1000 of FIG. 11, for example.

The switch network 1240 is coupled to the first reference voltage node 112 and to the second reference voltage node 114, such that individual switching devices of the switch network 1240 can selectively couple associated current sources of the current source network 1260 to, or decouple couple associated current sources of the current source network 1260 from, the first reference voltage Vref, as described above with reference to FIGS. 12a and 12b, such that an analog output signal at the output node 110 is representative of the digital input signal at the input nodes 102-108. As in the example illustrated in FIG. 11, the DAC circuitry 1200 has a non-monotonic transfer function.

Figures 13B, 13C, 13D, 13E:
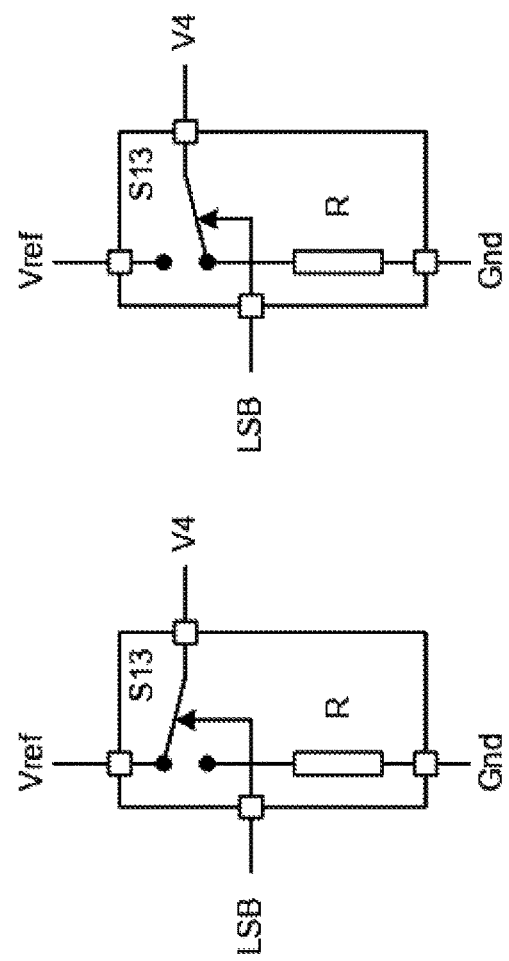

Alternatively, the individual switching devices of the switch network 1240 may be configured to selectively couple associated current sources of the current source network 1260 to the first reference voltage Vref or to the second reference voltage (e.g. ground), either directly as shown in FIGS. 13b and 13c, or via a series resistance as shown in FIGS. 13d and 13e, such that an analog output signal at the output node 110 is representative of the digital input signal at the input nodes 102-108. Coupling the current sources of the current source network to ground when they are not selected as shown in FIGS. 13c and 13e has the effect of reducing the time taken for the current sources to activate when they are selected, at the expense of increased power consumption of the DAC circuitry (because current flows to ground). Adding a series resistance as shown in FIGS. 13d and 13e may reduce the amount of current flowing to ground, in comparison to the arrangement of FIGS. 13b and 13d. It will be understood by those skilled in the art that the control of the current sources can be accomplished in a plurality of ways, however the overall behaviour remains: either switching in or out a current to effect a change in the DAC output depending on the digital control stimulus.

Figure 14:
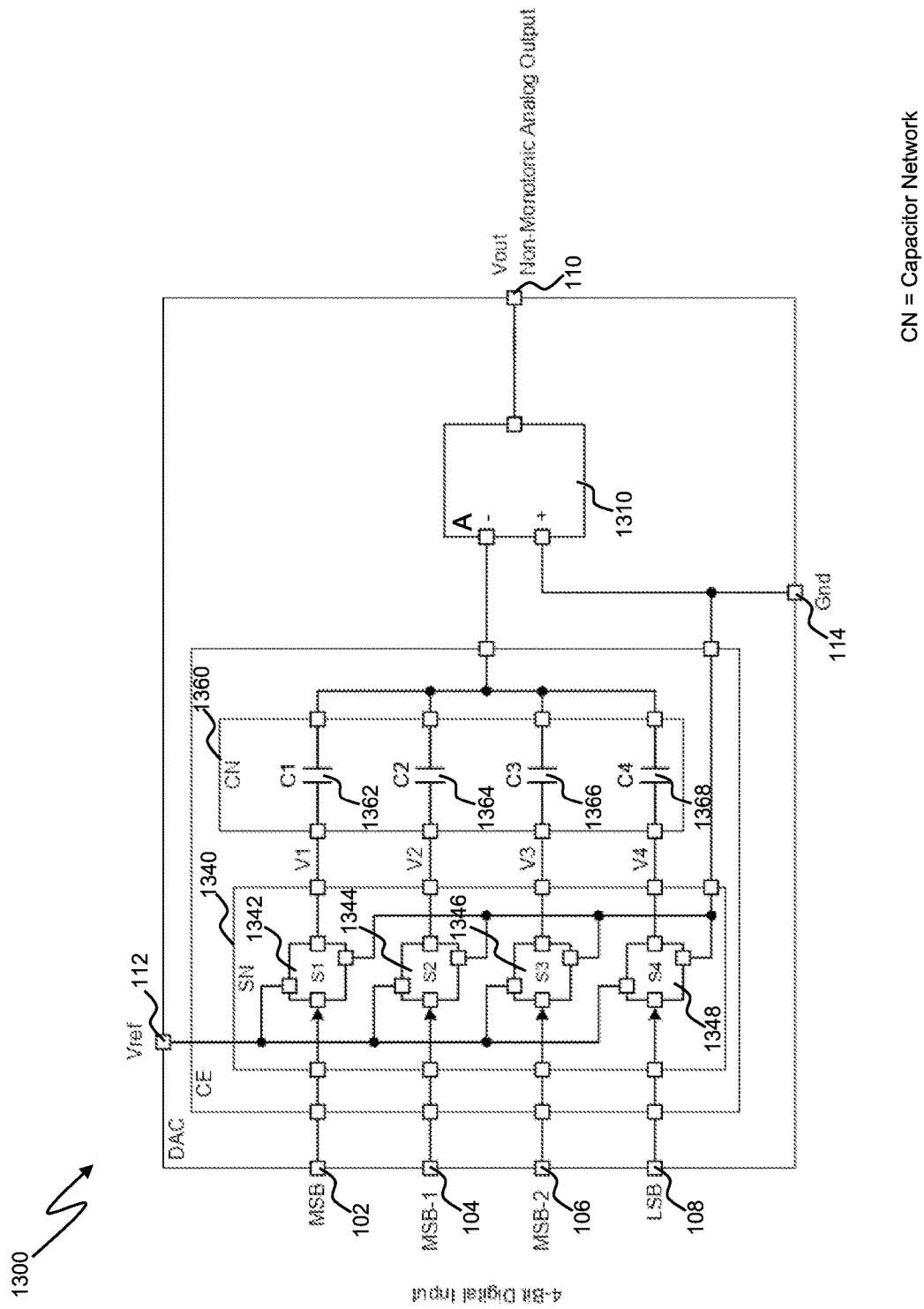
FIG. 14 is a schematic diagram illustrating further alternative 4-bit non-monotonic DAC circuitry comprising an array of configurable elements that includes a network of capacitances and a network of switching devices.

FIG. 14 is a schematic representation of 4-bit non-monotonic DAC circuitry 1300 which uses a plurality of capacitances as conversion elements.

The DAC circuitry 1300 includes a set of input nodes comprising first, second, third and fourth input nodes 102, 104, 106, 108 for receiving a 4-bit parallel digital input. The first input node 102 is configured to receive a most significant bit (MSB) of the digital input, whilst the fourth input node 108 is configured to receive a least significant bit (LSB) of the digital input. The second and third input nodes 104, 106 are configured to receive the second and third most significant bits, respectively, of the digital input. The DAC circuitry 100 also has an output node 110 for outputting an analog output signal Vout.

The DAC circuitry 1300 includes amplifier circuitry which in this example is implemented as an operational amplifier (op-amp) 1310 configured as a summing amplifier (but which could, where appropriate, be implemented as a buffer or buffer circuitry). A non-inverting input of the op-amp 1310 is coupled to the second reference voltage. An output terminal 1312 of the op-amp 1310 is coupled to the output terminal 110 of the DAC circuitry 1300 to provide the output analog signal Vout.

The DAC circuitry 1300 further includes an array 1320 of selectable conversion elements. The array 1320 includes a network 1340 of selection elements including first, second, third and fourth switch devices 1342, 1344, 1346, 1348 coupled to a network 1360 of capacitances including first, second, third and fourth capacitances 1362, 1364, 1366, 1368, such that each switch device 1342-1348 of the switch network 1340 controls the selection of an associated capacitance 1362-1368 of the capacitance network 1360.

A first plate of each of the capacitances 1364-1368 is coupled to the inverting input of the op-amp 1310, whilst a second plate of each of the capacitances 1364-1368 is coupled to a respective first, second, third or fourth controllable switching device 1342-1348, by means of which each of the capacitances 1362-1368 can be selectively coupled either to the first reference voltage (Vref) or to the second reference voltage, e.g. ground (Gnd).

A control terminal of each of the controllable switching devices 1342-1348 is coupled to a respective one of the input terminals 102, 104, 106, 108, such that a binary 1 (or "high") signal received at an input terminal 102, 104, 106, 108 will cause the associated switching device 1342-1348 to coupling the associated capacitance 1362-1368 to the reference voltage Vref, for example, whereas a binary 0 (or "low") signal received at an input terminal 102, 104, 106, 108 will cause the associated switching device 1342-1348 couple the associated capacitance 1362-1368 to ground (Gnd), for example.

Thus, the voltage at the non-inverting input of the op-amp 1310, and therefore the magnitude of the analog output signal Vout is dependent upon the value of the capacitances 1362-1338 that are coupled to the reference voltage Vref, which is in turn dependent upon the digital input code.

The capacitance values C1, C2, C3, C4 of the capacitances 1362-1368 are configured so as to produce a non-monotonic transfer function between the input DAC code and the output analog signal Vout. Any desired non-monotonic transfer function can be produced by appropriate configuration and selection of the capacitance values C1, C2, C3, C4 of the capacitances 1362-1368.

Figure 15:
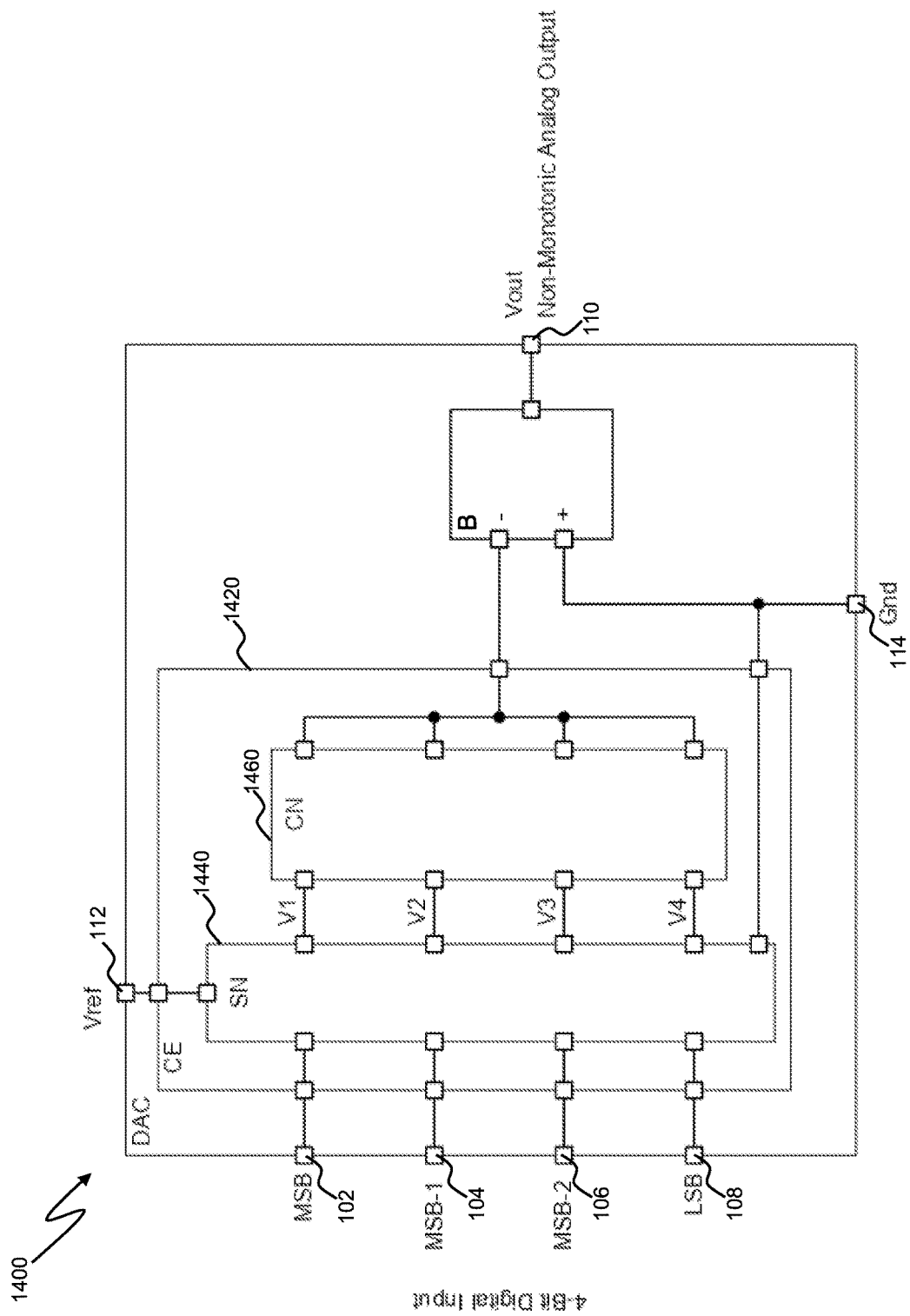
FIG. 15 is a generalised schematic diagram illustrating 4-bit non-monotonic DAC circuitry comprising an array of configurable elements that includes a network of capacitances and a network of switching devices.

FIG. 15 is a generalised schematic representation of 4-bit non-monotonic DAC circuitry 1400, comprising a set of input nodes 102, 104, 106, 108, an output node 110, a first reference voltage node 112 for coupling the DAC circuitry 1400 to a first reference voltage Vref and a second reference voltage node 114 for coupling the DAC circuitry 1400 to a second reference voltage, e.g. ground (Gnd). The DAC circuitry 1400 includes amplifier circuitry, in this example implemented as an op-amp 1410 having an output coupled to the output node 110 (but which could, where appropriate, be implemented as a buffer or buffer circuitry), and an array 1420 of selectable conversion elements.

The array 1420 includes a switch network 1440 that is coupled to the input nodes 102-108. The switch network 1440 may be similar to the switch network 1340 of the DAC circuitry 1300 of FIG. 14, for example.

The array 1420 also includes a capacitance network 1460, having inputs that are coupled to outputs of the switch network 1440 and outputs that are coupled to a first input of the op-amp 1410. A second input of the op-amp 1410 is coupled to the second reference voltage node 114. The capacitance network 1460 may be similar to the capacitance network 1360 of the DAC circuitry 1300 of FIG. 14, for example. Those skilled in the art will recognise that the op-amp can be connected to a separate reference voltage. Indeed, it is also recognised that the amplifier in some cases may not be necessary, depending on choice of circuit elements and circuit architecture. However, regardless of construct, the circuit is known as a DAC.

Because the transfer functions of the DAC circuitry of FIGS. 7, 10, 11, 13a, 14 and 15 are non-monotonic which results in a non-monotonic output signal, the circuitry 700, 900, 1000, 1200, 1300, 1400 is not suitable for applications in which accurate conversion of a particular input digital code into a particular analog signal value is required. However, the circuitry 700, 900, 1000, 1200, 1300, 1400 is well suited for applications in which a particular analog value must be identified, e.g. applications in which an offset such as a DC offset is to be corrected or compensated for.

Depending upon the configuration of the parameters of the conversion elements of the DAC circuitry of FIGS. 7, 10, 11, 13a, 14 and 15 (e.g. the resistance values, capacitance values or fixed current values of the respective resistances, capacitances or current sources used as conversion elements), the DAC circuitry illustrated in these Figures can provide a large range of possible analog output signal values or a small step size between analog signal values representing adjacent input codes. However, as the dynamic range increases, by having both large signal range and small step size, the demands placed on the circuit design and component consistency become increasingly challenging and complex. In certain applications, e.g. compensating for or correcting an offset (e.g. DC offset) or error in analog circuitry, however, there may be a requirement for both a large range of possible analog output signal values and a small step size between analog signal values representing adjacent input codes. In such an application, the range of possible offsets that must be corrected or compensated for may be large (e.g., +/−300 millivolts) compared to a DAC output step size, which may be of the order of 30 microvolts, for example (i.e. 0.01% of the possible offset range). Achieving this comparatively large range and comparatively small step size with a conventional parallel switched resistance array, for example, would require both small resistances and extremely large resistances in the array, and the matching of the resistances would have to be at least as good as the bit depth of the DAC, to provide compensation for very small (~0V) offset values and to achieve the 30 μV step size.

Figure 16:
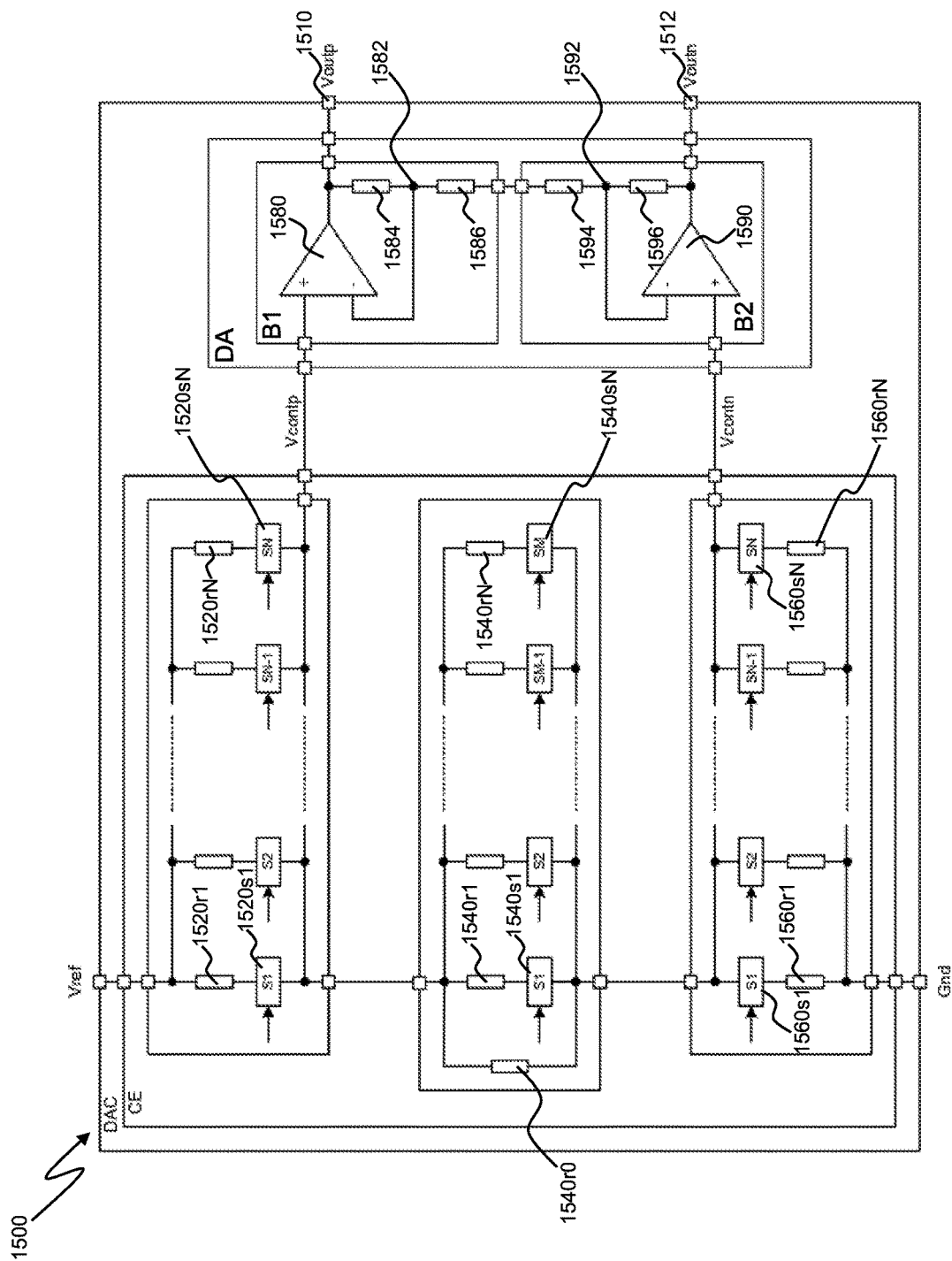
FIG. 16 is a generalised schematic diagram illustrating 4-bit non-monotonic DAC circuitry comprising an array of configurable elements that includes a network of circuit elements and a network of switching devices.

FIG. 16 is a schematic representation of an example of N-bit non-monotonic DAC circuitry 1500, where N is a positive integer value, that can meet the requirement for both a large range of possible analog output signal values and a small step size between analog signal values representing adjacent input codes.

The non-monotonic DAC circuitry 1500 in this example includes first, second and third arrays or networks 1520, 1540, 1560 of selectable parallel resistances connected in series between a reference voltage Vref and ground. The non-monotonic DAC circuitry 1500 produces a differential output voltage Voutp-Voutn.

The first array or network 1520 comprises a plurality of branches coupled in parallel between a reference voltage Vref and a node 1522 between the first array 1520 and the second array 1540. Each branch includes a resistance 1520$r$1-1520$r$N coupled in series with a controllable switching device (e.g. a transistor) 1520$s$1-1520$s$N such that each resistance can be selectively coupled between the reference voltage Vref and the node 1522. Control terminals (not shown in FIG. 16 for clarity) of the plurality of controllable switching devices 152$s$1-1520$s$N are coupled to control input terminals (also not shown for clarity) which are in turn configured to receive a first digital input code. The first digital input code thus controls the controllable switching devices 1520$s$1-1520$s$N so as to select the resistances 1520$r$1-1520$r$N to be coupled between the reference voltage Vref and the node 1522.

The second array 1540 comprises a first resistance 1540$r$0 coupled between the node 1522 and a node 1542 between the second array 1540 and the third array 1560 and a plurality of branches coupled in parallel with the first resistance 1540$r$0. Each branch includes a resistance 1540$r$1-1540$r$N coupled in series with a controllable switching device (e.g. a transistor) 1540$s$1-1540$s$N such that each resistance can be selectively coupled between the node 1522 and the node 1542. Control terminals (not shown in FIG. 16 for clarity) of the plurality of controllable switching devices 1540$s$1-1540$s$N are coupled to control input terminals (also not shown for clarity) which are in turn configured to receive a second digital input code. The second digital input code thus controls the controllable switching devices 1540$s$1-1540$s$N so as to select the resistances 1540$r$1-1540$r$N to be coupled between the reference voltage of the node 1522 and the node 1542.

The third array 1560 comprises a plurality of branches coupled in parallel between the node 1542 and ground. Each branch includes a resistance 1560$r$1-860$r$N coupled in series with a controllable switching device (e.g. a transistor) 1560$s$1-1560$s$N such that each resistance can be selectively coupled between the node 1542 and ground. Control terminals (not shown in FIG. 16 for clarity) of the plurality of controllable switching devices 1560$s$1-1560$s$N are coupled to control input terminals (also not shown for clarity) which are in turn configured to receive a third digital input code. The third digital input code thus controls the controllable switching devices 1560$s$1-1560$s$N so as to select the resistances 1560$r$1-1560$r$N to be coupled between node 1542 and ground. In use of the DAC circuitry 1500 the third input code is typically the same as the first input code.

The first, second and third arrays 1520, 1540, 1560 form a voltage divider arrangement, which develops a first output voltage Vcontp between the node 1522 and ground and a second output voltage Vcontn between the node 1542 and ground.

A first output amplifier 1580 receives the first output voltage Vcontp at a first input (which, in the illustrated example, is a non-inverting (+) input) thereof. A node 1582 between first and second feedback resistances 1584, 1586 is coupled to a second input (in this example the inverting (−) input) of the first output amplifier 1580, thus forming a feedback path between the output of the first output amplifier 1580 and its second input. An output of the first output amplifier 1580 is coupled to a first differential output terminal 1510, such that an output Voutp of the first output amplifier 1580 is provided to the first differential output terminal 1510.

A second output amplifier 1590 receives the second output voltage Vcontn at a first input (which, in the illustrated example, is a non-inverting (+) input) thereof. A node 1592 between third and fourth feedback resistances 1594, 1596 is coupled to a second input (in this example the inverting (−) input) of the second output amplifier 1590, thus forming a feedback path between the output of the second output amplifier 1590 and its second input. An output of the second output amplifier 1590 is coupled to a second differential output terminal 1512, such that an output Voutn of the second output amplifier 1590 is provided to the second differential output terminal 1512.

Thus, the circuitry 1500 provides first and second output voltages Voutp, Voutn which provide a differential output voltage Voutp-Voutn.

The first and second output voltages Vcontp and Vcontn are dependent upon the resistances 1520r1-1520rN, 1540r1-1540rN, 1560r1-1560rN that are selected, and thus are dependent upon the first, second and third input codes input to the controllable switching devices 1520s1-1520sN, 1540s1-1540sN, 1560s1-1560sN of the first, second and third arrays.

The resistance value of each resistance 1520r1-1520rN of the first array 1520 is substantially the same as the value of the corresponding resistance 1560r1-1560rN of the third array 1560. The values of these resistances are configured or selected so as to generate a first non-monotonic differential output voltage range for a given range of input codes input to the first and third arrays 1520, 1560.

The resistance values of the resistances 1540r1-1540rN of the second array 1540 can be different than those of the resistances of the first and third arrays 1560, and are selected or configured so as to generate a monotonic differential output voltage within the range defined by the first and third arrays 820, 860 for a given range of input codes input to the second array 1540. (In alternative examples the resistance values of the resistances 1540r1-1540rN of the second array 1540 can be selected or configured so as to generate a non-monotonic differential output voltage within the range defined by the first and third arrays 820, 860 for a given range of input codes input to the second array 1540).

Thus, as will be appreciated, the combination of the first, second and third arrays 1520, 1540, 1560 of the circuitry 1500 of FIG. 16 constitutes a non-monotonic digital to analog converter. The resolution of the DAC is determined by the number of parallel resistances 1520r1-1520rN, 1540r1-1540rN, 1560r1-1560rN in each of the arrays 1520, 1540, 1560 and their relative resistance values or weightings. Those skilled in the art will recognise that the amplifier may not be necessary, for example the differential signal generated from Vcontp and Vcontn can be considered the DAC output. However, regardless of construct, the circuit is known as a DAC.

By appropriate configuration of the resistances of the first and third arrays 1520, 1560, a non-monotonic output voltage range can be produced. For example, by configuring first resistances of the first and third arrays 1520, 1560 with a first set of resistance values a first output voltage range can be produced. By configuring second resistances of the first and third arrays 1520, 1560 with a second set of resistance values a second voltage range can be produced that overlaps with the first voltage range. By configuring third resistances of the first and third arrays 1520, 1560 with a third set of resistance values a third voltage range can be produced that overlaps with the second voltage range (and if desired the first) and so on. Within each of the voltage ranges set by the first and third arrays 1520, 1560 the second 1540 array determines the small step size. The combination of the non-monotonic voltage ranges and the small step size of the second array 1540 provides a non-monotonic DAC with a large output range and also a small step size between analogue DAC output signal values.

As indicated above, the non-monotonic DAC circuitry disclosed herein is not suitable for applications where accurate conversion between an input digital code representing, for example, a decimal value and an output analog signal value is required, but is well suited to applications such as error or offset correction or compensation, in which an analog signal of a particular value is required to compensate for or correct an error or offset. The DAC circuitry 1500 is particularly suited to such applications, as the overlapping non-monotonic output signal ranges produced by the circuitry enable a particular analog output signal value to be found quickly and easily, for example by cycling (e.g. sequentially) through a predefined set of code values for the first and third input codes that are input to the controllable switching devices of the first and third arrays 1520, 1560 to find an approximate within the first non-monotonic range for a desired analog output value, and then cycling (e.g. sequentially) through a predefined set of code values for the second input code that is input to the controllable switching device of the second array 1540 to refine the output value with the second range.

Although the circuitry 1500 is shown as having first, second and third arrays or networks 1520, 1540, 1560 of selectable conversion elements (in this example selectable resistances) it will be appreciated by those skilled in the art that the circuitry 1500 may be provided with more than three arrays or networks of selectable conversion elements, to provide more than one non-monotonic output range (i.e. nested non-monotonic ranges) and more than two output voltages. Similarly, fewer arrays of selectable conversion elements (two) can be used to provide one output voltage whilst retaining non-monotonic behaviour.

Further, although the arrays 1520, 1540, 1560 are shown as comprising parallel switched resistances, it will be appreciated that alternative array or network configurations, such as ladder arrays or networks, could form the arrays 1520, 1540, 1560, or be used to condense the arrays 1520, 1540, 1560.

Moreover, although the circuitry 1500 is shown as using resistances as conversion elements, it will be appreciated that different conversion elements, such as capacitances or current sources could be used, with a parameter of each of the conversion elements (e.g. a capacitance value, where the conversion elements are capacitances or an output current value where the conversion elements are current sources) being configured so as to provide a desired non-monotonic output range.

Figure 17:
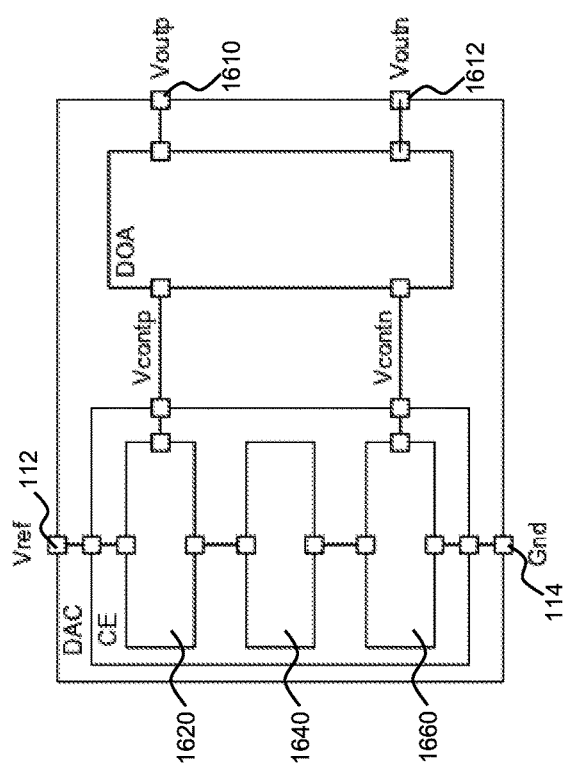
FIG. 17 is a schematic diagram illustrating non-monotonic DAC circuitry that provides different non-monotonic ranges.

FIG. 17 is a generalised schematic diagram illustrating N-bit non-monotonic DAC circuitry 1600 (where N is a positive integer). The DAC circuitry 1600 includes a first reference voltage node 112 for coupling the circuitry 1600 to a first reference voltage (Vref) and a second reference voltage node 114 for coupling the circuitry 1600 to a second reference voltage such as ground (Gnd). The circuitry 1600 also has first and second output nodes 1610, 1612 for providing a differential output signal Voutp-Voutn.

The DAC circuitry 1600 also includes a plurality (in this example three) of arrays or networks 1620, 1640, 1660 of selectable conversion elements. The selectable conversion elements may be, for example, resistances (as in the circuitry 1500 of FIG. 16), capacitances or current sources.

Outputs of the arrays or networks of selectable conversion elements are coupled to inputs of a dual op-amp block 1680. Outputs of the dual op-amp block 1680 are coupled to the first and second output nodes 1610, 1612 to provide the differential output signal Voutp-Voutn.

By appropriate configuration of the selectable conversion elements of the first and third arrays 1620, 1660, a non-monotonic output voltage signal can be produced. For example, by configuring first selectable conversion elements of the first and third arrays 1620, 1660 with a first set of parameter values a first output voltage range can be produced. By configuring second selectable conversion elements of the first and third arrays 1620, 1660 with a second set of parameter values a second voltage range can be produced that overlaps with the first voltage range. By configuring third selectable conversion elements of the first and third arrays 1620, 1660 with a third set of parameter values a third voltage range can be produced that overlaps with the second voltage range (and if desired the first) and so on. Within each of the voltage ranges set by the first and third arrays 1620, 1660 the second 1640 array determines the small step size. The combination of the non-monotonic voltage ranges and the small step size of the second array 1640 provides a non-monotonic DAC with a large output range and also a small step size between analogue DAC output signal values.

Although the circuitry 1600 is shown as having first, second and third arrays or networks 1620, 1640, 1660 of selectable conversion elements (in this example selectable resistances) it will be appreciated by those skilled in the art that the circuitry 1600 may be provided with more than three arrays or networks of selectable conversion elements, to provide more than one non-monotonic output range (i.e. nested non-monotonic ranges) and more than two output voltages. Similarly, fewer arrays of selectable conversion elements (two) can be used to provide one output voltage whilst retaining non-monotonic behaviour.

Further, the arrays 1620, 1640, 1660 may comprise parallel selectable conversion elements or may alternatively comprise alternative configurations of selectable conversion elements such as ladder arrays or networks. It will be appreciated by those skilled in the art that the dependent on the circuit elements the dual op-amp can be configured such that the non-inverting input receives the signal and the inverting input is configured as a buffer and receives the output or the inverting input receives the signal and the output is connected to the input via a feedback element and the non-inverting input is connected to a reference. Indeed, it is also recognised that the amplifier in some cases may not be necessary, depending on choice of circuit elements and circuit architecture. However, regardless of construct, the circuit is known as a DAC.

The DAC circuitry is described above with reference to the Figures as using switching devices to select conversion elements according to the input DAC code. As will be appreciated by those skilled in the art, the switching devices could be any suitable controllable switching device. For example, the switching devices could be transistors, in particular MOS transistors.

Further, where the conversion elements are resistances, capacitances or current sources, instead of (or in addition to) configuring the parameters of the conversion elements so as to achieve a desired non-monotonic output range, a desired non-monotonic output range may also be achieved through the use of multiple appropriately configured reference voltage sources coupled to the conversion elements.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Digital to analog conversion circuitry comprising:
a set of input nodes for receiving a digital input code;
an output node for outputting an analog output signal representative of the input code; and
a plurality of selectable conversion elements;
wherein the plurality of selectable conversion elements is arranged in a plurality of arrays of selectable conversion elements, and wherein a parameter of each of the plurality of selectable conversion elements of each of the plurality of arrays is configured such that a transfer function between an input code input to the array and an analog signal output by the array is non-monotonic.

2. Digital to analog conversion circuitry according to claim 1, wherein the circuitry comprises first, second and third arrays of selectable conversion elements.

3. Digital to analog conversion circuitry according to claim 2, wherein the conversion elements of the third array have the same parameter values as corresponding conversion elements of the first array.

4. Digital to analog conversion circuitry according to claim 2, wherein the first, second and third arrays of selectable conversion elements are arranged in series between a reference voltage and ground.

5. Digital to analog conversion circuitry according to claim 4, wherein the circuitry is configured to produce a differential output signal between a first output node between the first array and second array and a second output node between the second array and the third array.

6. Digital to analog conversion circuitry according to claim 5, further comprising a first output amplifier having an input coupled to the first output node and a second output amplifier coupled to the second output node.

7. Digital to analog conversion circuitry according to claim 2, wherein the first, second and third arrays comprise selectable resistances or selectable capacitances.

8. Digital to analog conversion circuitry according to claim 1 wherein the plurality of selectable conversion elements comprise selectable resistances and the parameter comprises a resistance value.

9. Digital to analog conversion circuitry according to claim 8, wherein the resistances are coupled in parallel with each other.

10. Digital to analog conversion circuitry according to claim 1 wherein the plurality of selectable conversion elements comprise selectable capacitances and wherein the parameter comprises a capacitance value.

11. Digital to analog conversion circuitry according to claim 1, wherein the resistances are arranged in a ladder configuration.

12. Digital to analog conversion circuitry according to claim 1 wherein the plurality of selectable conversion elements comprise selectable current sources and wherein the parameter comprises an output current value.

13. A digital to analog converter (DAC) comprising:
a plurality of arrays of selectable conversion elements; and
amplifier circuitry,
wherein the plurality of selectable conversion elements of each of the plurality of arrays are weighted so as to produce a plurality of overlapping DAC output signal ranges.

14. A DAC according to claim 13, wherein the amplifier circuitry comprises operational amplifier or buffer circuitry.

15. A DAC according to claim 13 wherein the selectable conversion elements are resistors.

16. A DAC according to claim 13 wherein the selectable conversion elements are capacitors.

17. A DAC according to claim 13 wherein the selectable conversion elements are current sources.

18. Digital to analog converter (DAC) circuitry for receiving digital input codes and outputting analog signals representative of the input codes, comprising:
a plurality of selectable conversion elements for providing either a monotonic or non-monotonic transfer function based on one or more of the plurality of selectable conversion elements, wherein the plurality of selectable conversion elements is arranged in a plurality of arrays of selectable conversion elements.

* * * * *

UNITED STATES PATENT AND TRADEMARK OFFICE
CERTIFICATE OF CORRECTION

| | | |
|---|---|---|
| PATENT NO. | : 11,303,294 B2 | |
| APPLICATION NO. | : 17/086949 | |
| DATED | : April 12, 2022 | |
| INVENTOR(S) | : Gavin McVeigh | |

It is certified that error appears in the above-identified patent and that said Letters Patent is hereby corrected as shown below:

In the Claims

Column 22, Line 17, in Claim 11, delete "claim 1," and insert -- claim 8, --, therefor.

Column 22, Line 27, in Claim 13, delete "the plurality" and insert -- a plurality --, therefor.

Signed and Sealed this
Twenty-ninth Day of August, 2023

*Katherine Kelly Vidal*

Katherine Kelly Vidal
*Director of the United States Patent and Trademark Office*